(12) United States Patent
Feng et al.

(10) Patent No.: US 10,902,932 B2
(45) Date of Patent: Jan. 26, 2021

(54) GATE DRIVE CIRCUIT, METHOD OF DRIVING GATE DRIVE CIRCUIT, DISPLAY DEVICE, AND METHOD OF MANUFACTURING ARRAY SUBSTRATE

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN); Meng Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/398,706

(22) Filed: Apr. 30, 2019

(65) Prior Publication Data
US 2020/0035317 A1 Jan. 30, 2020

(30) Foreign Application Priority Data
Jul. 25, 2018 (CN) .......................... 2018 1 0829852

(51) Int. Cl.
G09G 5/10 (2006.01)
G11C 19/28 (2006.01)
(Continued)

(52) U.S. Cl.
CPC .............. *G11C 19/287* (2013.01); *G09G 3/20* (2013.01); *H01L 27/1262* (2013.01);
(Continued)

(58) Field of Classification Search
USPC ..... 345/55, 98, 100, 211, 212, 214, 77, 690, 345/691, 209; 349/152
See application file for complete search history.

(56) References Cited

U.S. PATENT DOCUMENTS

2006/0164587 A1* 7/2006 Oh ....................... G09G 3/3611
349/152
2007/0132674 A1* 6/2007 Tsuge ................... G09G 3/3283
345/77
(Continued)

FOREIGN PATENT DOCUMENTS

CN 1912966 A 2/2007
CN 102376254 A 3/2012
(Continued)

OTHER PUBLICATIONS

Oct. 15, 2019—(CN) First Office Action Appn 201810829852.X with English Translation.

*Primary Examiner* — Thuy N Pardo
(74) *Attorney, Agent, or Firm* — Banner & Witcoff, Ltd.

(57) ABSTRACT

A gate drive circuit, a method of driving a gate drive circuit, a display device, and a method of manufacturing an array substrate are provided. The gate drive circuit includes a repair signal line, a plurality of output signal lines, and a plurality of shift register units that are cascaded. The repair signal line is configured to transmit the repair signal to the first output signal line. The plurality of shift register units include a first shift register unit and a plurality of second shift register units, and the plurality of second shift register units are correspondingly connected to the second output signal lines. The first output signal line corresponds to but is in a state of being disconnected to the first shift register unit, and the first output signal line and the plurality of second output signal lines are configured to output a set of shift pulse signals.

15 Claims, 9 Drawing Sheets

(51) Int. Cl.
    *G09G 3/20*         (2006.01)
    *H01L 27/12*        (2006.01)
(52) U.S. Cl.
    CPC ........... *G09G 2300/0426* (2013.01); *G09G 2310/0286* (2013.01); *G09G 2310/08* (2013.01); *G09G 2330/08* (2013.01)

(56) References Cited

U.S. PATENT DOCUMENTS

| | | | | |
|---|---|---|---|---|
| 2007/0132700 | A1* | 6/2007 | Cho | G11C 19/00 345/100 |
| 2009/0128533 | A1* | 5/2009 | Tsubata | G09G 3/3648 345/209 |
| 2010/0165012 | A1* | 7/2010 | Koyama | G09G 3/30 345/690 |
| 2015/0042550 | A1* | 2/2015 | Wang | G09G 3/3611 345/98 |
| 2015/0109285 | A1* | 4/2015 | Liang | G11C 19/184 345/214 |
| 2015/0228243 | A1* | 8/2015 | Liao | G09G 3/3677 345/212 |
| 2016/0148578 | A1* | 5/2016 | Kishi | G09G 3/3291 345/212 |
| 2016/0171933 | A1* | 6/2016 | Takahara | G09G 3/3258 345/212 |
| 2016/0189794 | A1* | 6/2016 | Lou | G11C 19/28 345/214 |
| 2016/0196781 | A1* | 7/2016 | Tanaka | G09G 3/3677 345/691 |
| 2017/0140703 | A1* | 5/2017 | Nishikawa | G11C 19/28 345/55 |
| 2018/0174507 | A1* | 6/2018 | Ohara | G09G 3/3266 345/690 |
| 2018/0342208 | A1* | 11/2018 | Nishikawa | G09G 3/3291 345/55 |
| 2019/0221181 | A1 | 7/2019 | Li et al. | |

FOREIGN PATENT DOCUMENTS

| | | |
|---|---|---|
| CN | 106887217 A | 6/2017 |
| KR | 1020170078978 A | 12/2015 |

* cited by examiner

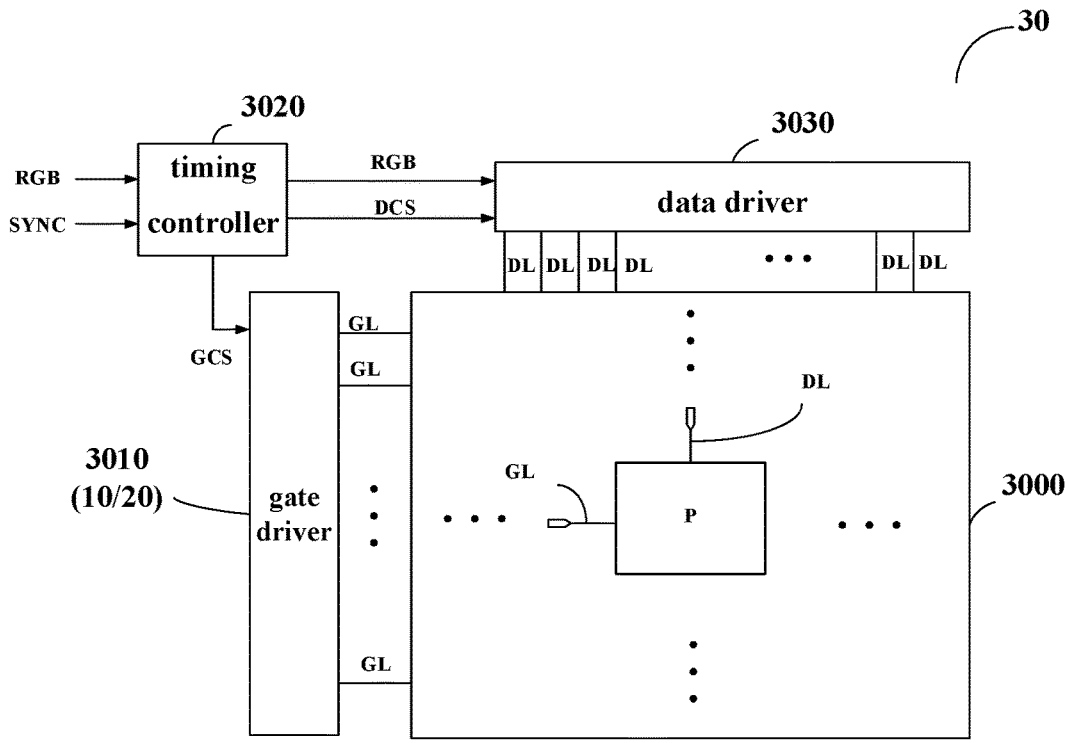

FIG. 10 forming a plurality of shift register units that are cascaded and a plurality of output signal lines on a base substrate, the plurality of shift register units being correspondingly connected to the plurality of output signal lines, and forming a repair signal generation circuit and a repair signal line on the base substrate, the repair signal generation circuit being connected to the repair signal line, the repair signal line and the plurality of output signal lines being insulated from each other, and the repair signal line extending across the plurality of output signal lines — S110 selecting a first shift register unit among the plurality of shift register units as needed, the plurality of output signal lines comprising a first output signal line, and the first shift register unit being connected to the first output signal line — S120 connecting the repair signal line to the first output signal line, and disconnecting the first output signal line from the first shift register unit — S130

FIG. 11

GATE DRIVE CIRCUIT, METHOD OF DRIVING GATE DRIVE CIRCUIT, DISPLAY DEVICE, AND METHOD OF MANUFACTURING ARRAY SUBSTRATE

CROSS-REFERENCE TO RELATED APPLICATION

The present application claims priority of Chinese Patent Application No. 201810829852.X filed on Jul. 25, 2018, the disclosure of which is incorporated herein by reference in its entirety as part of the present application.

TECHNICAL FIELD

Embodiments of the present disclosure relate to a gate drive circuit, a method of driving a gate drive circuit, a display device, and a method of manufacturing an array substrate.

BACKGROUND

In a field of display technology, for example, a pixel array of an organic light emitting diode (OLED) display panel generally comprises a plurality of rows of gate lines and a plurality of columns of data lines interleaved therewith. The driving of the gate lines can be achieved by a bonded integrated drive circuit. In recent years, with continuous improvement of preparation processes of amorphous silicon thin film transistors or oxide thin film transistors, a gate drive circuit can also be directly formed on an array substrate to function as a GOA (Gate driver On Array) to drive the gate lines. For example, a GOA consisting of a plurality of shift register units that are cascaded can be used to provide on-state and off-state voltage signals for the plurality of rows of gate lines of the pixel array, for example, so as to control the plurality of rows of gate lines to be sequentially turned on, and at the same time, data signals are provided to pixel units of corresponding rows in the pixel array through the data lines. Therefore, gray scale voltages required for respective gray scales of a displayed image in respective pixel units are generated, and furthermore a frame of image is displayed. Currently, display panels increasingly adopt GOA technology to drive the gate lines. The GOA technology is conducive to achieving a narrow bezel and reducing production cost.

SUMMARY

At least one embodiment of the present disclosure provides a gate drive circuit, which comprises: a repair signal line, a plurality of output signal lines, and a plurality of shift register units that are cascaded, in which, the repair signal line is configured to receive a repair signal; the plurality of output signal lines comprise a first output signal line and a plurality of second output signal lines, and the repair signal line is connected to the first output signal line, and is configured to transmit the repair signal to the first output signal line; the plurality of shift register units comprise a first shift register unit and a plurality of second shift register units, and the plurality of second shift register units are correspondingly connected to the plurality of second output signal lines; and the first output signal line corresponds to but is in a state of being disconnected to the first shift register unit, and the first output signal line and the plurality of second output signal lines are further configured to output a set of shift pulse signals.

For example, the gate drive circuit provide by an embodiment of the present disclosure further comprises a repair signal generation circuit, the repair signal generation circuit is connected to the repair signal line, and is configured to output the repair signal to the repair signal line, and the repair signal generation circuit and the plurality of second shift register units are further configured to output the set of shift pulse signals through the first output signal line and the plurality of second output signal lines.

For example, in the gate drive circuit provide by an embodiment of the present disclosure, the repair signal line is in a layer which is different from a layer where the plurality of output signal lines are located, and the repair signal line extends across the plurality of output signal lines.

For example, the gate drive circuit provide by an embodiment of the present disclosure further comprises a plurality of cascade signal lines, and the first output signal line is connected to a next second shift register unit adjacent to the first shift register unit through a cascade signal line which corresponds to but is in a state of being disconnected to the first shift register unit, and is configured to transmit the repair signal as a trigger signal to the next second shift register unit adjacent to the first shift register unit.

For example, in the gate drive circuit provide by an embodiment of the present disclosure, each of the plurality of shift register units comprises a trigger signal output terminal and a pixel scanning signal output terminal, pixel scanning signal output terminals of the plurality of second shift register units are correspondingly connected to the plurality of second output signal lines, and trigger signal output terminals of the plurality of second shift register units are correspondingly connected to the plurality of cascade signal lines.

For example, in the gate drive circuit provide by an embodiment of the present disclosure, the plurality of cascade signal lines and the repair signal line are in a same layer, and the plurality of cascade signal lines are in the layer which is different from a layer where the plurality of output signal lines are located.

For example, in the gate drive circuit provide by an embodiment of the present disclosure, the repair signal generation circuit comprises a modulation signal output circuit and a switch circuit which are electrically connected to each other; the modulation signal output circuit is configured to output a modulation signal to the switch circuit; and the switch circuit is configured to receive the modulation signal and control whether the modulation signal passes through the switch circuit, to output the modulation signal passing through the switch circuit as the repair signal.

For example, in the gate drive circuit provide by an embodiment of the present disclosure, the repair signal generation circuit comprises a third shift register unit, and the third shift register unit is identical in circuit structure to the first shift register unit and is configured to generate a shift pulse signal corresponding to the first shift register unit in the set of shift pulse signals, and to output the shift pulse signal as the repair signal.

For example, in the gate drive circuit provide by an embodiment of the present disclosure, each of the plurality of shift register units comprises a blanking input circuit, a display input circuit, an output circuit, a first control circuit and a second control circuit; the blanking input circuit is connected to a first node, and is configured to input a blanking pull-up signal to the first node, according to a blanking input signal and a blanking control signal, during a blanking period; the display input circuit is connected to the first node, and is configured to input a display pull-up signal to the first node in response to a display input signal during a display period; the output circuit is connected to the first node, and is configured to output a composite output signal to an output terminal under control of a level of the first node; the first control circuit is connected to the first node and a second node, and is configured to perform noise reduction on the first node and the output terminal under control of a level of the second node; and the second control circuit is connected to the first node and the second node, and is configured to control the level of the second node under control of the level of the first node.

At least one embodiment of the present disclosure further provides a method of driving the gate drive circuit according to any one of the embodiments of the present disclosure, which comprises: controlling the plurality of shift register units that are cascaded to sequentially output; and in a case where the first shift register unit outputs, outputting the repair signal to the repair signal line, so that the first output signal line outputs the repair signal, in which, the first output signal line and the plurality of second output signal lines output the set of shift pulse signals.

At least one embodiment of the present disclosure further provides a gate drive circuit, which comprises a repair signal line, a plurality of output signal lines, and a plurality of shift register units that are cascaded. The repair signal line is configured to receive a repair signal or a first voltage; the plurality of shift register units are correspondingly connected to the plurality of output signal lines, and are configured to output a set of shift pulse signals through the plurality of output signal lines; and the repair signal line and the plurality of output signal lines are insulated from each other, the repair signal line extends across the plurality of output signal lines.

For example, the gate drive circuit provide by an embodiment of the present disclosure further comprises a repair signal generation circuit. The repair signal generation circuit is connected to the repair signal line, and is configured to output the repair signal or the first voltage to the repair signal line.

For example, in the gate drive circuit provide by an embodiment of the present disclosure, the repair signal line is in a layer which is different from a layer where the plurality of output signal lines are located.

For example, the gate drive circuit provide by an embodiment of the present disclosure further comprises a plurality of cascade signal lines. Each of the plurality of shift register units comprises a trigger signal output terminal and a pixel scanning signal output terminal, pixel scanning signal output terminals of the plurality of shift register units are correspondingly connected to the plurality of output signal lines, and trigger signal output terminals of the plurality of shift register units are correspondingly connected to the plurality of cascade signal lines.

For example, in the gate drive circuit provide by an embodiment of the present disclosure, the plurality of cascade signal lines and the repair signal line are in a same layer, and the plurality of cascade signal lines are in the layer which is different from a layer where the plurality of output signal lines are located, and a cascade signal line and an output signal line which are connected to a same shift register unit are insulated from each other, and extend across each other.

At least one embodiment of the present disclosure further provides a method of driving the gate drive circuit according to any one of the embodiments of the present disclosure, which comprises: controlling the plurality of shift register units that are cascaded to sequentially output, and outputting the set of shift pulse signals through the plurality of output signal lines; and outputting the first voltage to the repair signal line, the first voltage being same as a non-operating level of the shift pulse signals.

At least one embodiment of the present disclosure further provides a display device, which comprises the gate drive circuit of any one of the embodiments of the present disclosure.

At least one embodiment of the present disclosure further provides a method of manufacturing an array substrate, which comprises: forming a plurality of shift register units that are cascaded and a plurality of output signal lines on a base substrate, the plurality of shift register units being correspondingly connected to the plurality of output signal lines, forming a repair signal generation circuit and a repair signal line on the base substrate, the repair signal generation circuit being connected to the repair signal line, the repair signal line and the plurality of output signal lines being insulated from each other, and the repair signal line extending across the plurality of output signal lines; selecting a first shift register unit among the plurality of shift register units as needed, the plurality of output signal lines comprising a first output signal line, and the first shift register unit being connected to the first output signal line; and connecting the repair signal line to the first output signal line, and disconnecting the first output signal line from the first shift register unit.

For example, the method of manufacturing the array substrate provide by an embodiment of the present disclosure further comprises: forming a plurality of cascade signal lines on the base substrate, the plurality of cascade signal lines and the plurality of output signal lines being in a same layer and being correspondingly connected.

For example, the method of manufacturing the array substrate provide by an embodiment of the present disclosure further comprises: forming a plurality of cascade signal lines on the base substrate, the plurality of cascade signal lines and the repair signal line being in a same layer, the plurality of cascade signal lines extending across the plurality of output signal lines, and the plurality of cascade signal lines being correspondingly connected to the plurality of shift register units; and disconnecting a cascade signal line connected to the first shift register unit from the first shift register unit, and connecting the cascade signal line that is disconnected to the first output signal line.

BRIEF DESCRIPTION OF THE DRAWINGS

In order to clearly illustrate the technical solutions of the embodiments of the disclosure, the drawings of the embodiments will be briefly described in the following; and it is obvious that the described drawings are only related to some embodiments of the disclosure and thus are not limitative to the disclosure.

FIG. 10 is a schematic block diagram of a display device according to some embodiments of the present disclosure; and FIG. 11 is a schematic flow chart of a method of manufacturing an array substrate according to some embodiments of the present disclosure.

DETAILED DESCRIPTION

Figure 1:
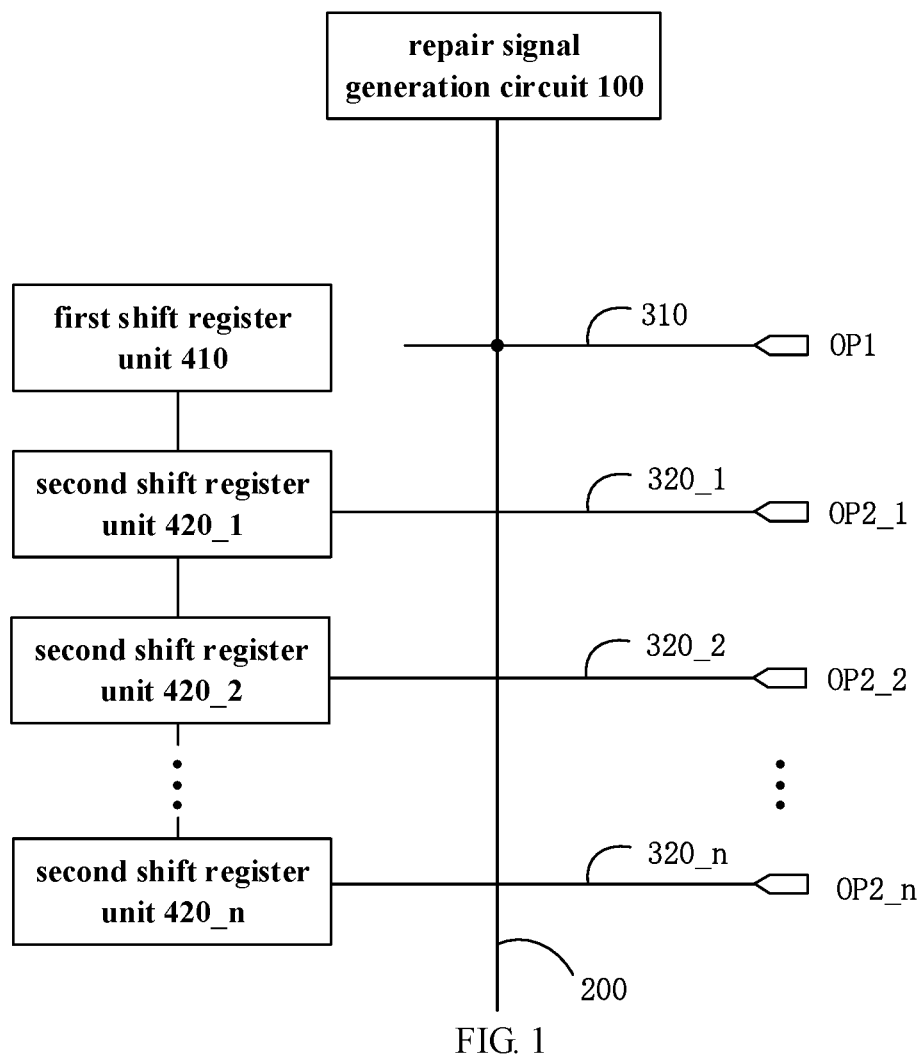
FIG. 1 is a schematic block diagram of a gate drive circuit according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A gate drive circuit typically comprises a plurality of shift register units that are cascaded. Because the circuit structure is complicated, the gate drive circuit is prone to failure, for example, a case where a certain shift register unit outputs abnormally is prone to occur. In this case, when the output is abnormal, because the connection of the shift register units is complicated, it is difficult to find the reason causing the problem of the shift register unit that outputs abnormally. Therefore, a yield of the product (for example, a display panel) including the gate drive circuit is affected, and the manufacturing cost of the product is increased. Moreover, it is relatively difficult to repair faults that occur during the use of the product.

At least one embodiment of the present disclosure provides a gate drive circuit, a method of driving a gate drive circuit, a display device, and a method of manufacturing an array substrate. The gate drive circuit can isolate an abnormal shift register unit, and ensure the output of the shift pulse signals at the same time, so as to help to improve the product yield, improve maintenance efficiency, and reduce product manufacturing cost.

Hereinafter, embodiments of the present disclosure are described in detail with reference to the accompanying drawings. It should be noted that the same reference numeral can be used in different drawings to refer to the same element that has been described.

At least one embodiment of the present disclosure provides a gate drive circuit, which comprises a repair signal line, a plurality of output signal lines, and a plurality of shift register units that are cascaded. The repair signal line is configured to receive a repair signal. The plurality of output signal lines comprise a first output signal line and a plurality of second output signal lines, and the repair signal line is connected to the first output signal line, and is configured to transmit the repair signal to the first output signal line. The plurality of shift register units comprise a first shift register unit and a plurality of second shift register units, and the plurality of second shift register units are correspondingly connected to the plurality of second output signal lines. The first output signal line corresponds to the first shift register unit but is in a state of being disconnected to the first shift register unit, and the first output signal line and the plurality of second output signal lines are further configured to output a set of shift pulse signals.

FIG. 1 is a schematic block diagram of a gate drive circuit according to some embodiments of the present disclosure. Referring to FIG. 1, a gate drive circuit 10 comprises a repair signal line 200, a plurality of output signal lines OP1, OP2_1, OP2_2, . . . OP2_n, and a plurality of shift register units 410, 420_1, 420_2, . . . 420_n that are cascaded. For example, in some examples, the gate drive circuit 10 may further comprise a repair signal generation circuit 100. The gate drive circuit 10 can be used to drive a display panel, such as sequentially providing scanning signals for a plurality of gate lines of the display panel, so that the display panel performs progressive scanning, interlaced scanning or the like during displaying a frame of image.

The repair signal line 200 is configured to receive a repair signal. In a case where the gate drive circuit 10 comprises the repair signal generation circuit 100, the repair signal generation circuit 100 is connected to the repair signal line 200 and is configured to output the repair signal to the repair signal line 200. For example, a waveform and timing of the repair signal can be adjusted to meet the needs of actual applications. The repair signal generation circuit 100 can be implemented as a circuit including a plurality of thin film transistors, can also be implemented as any form of analog or digital circuits, or can be integrated into a chip located outside an array substrate, and the embodiments of the present disclosure are not limited thereto.

The plurality of output signal lines comprises a first output signal line 310 and a plurality of second output signal lines 320_1, . . . 320_n. The repair signal line 200 is connected to the first output signal line 310, and is configured to transmit the repair signal to the first output signal line 310. For example, the repair signal line 200 is insulated from the plurality of second output signal lines 320_1, . . . 320_n, and is only connected to the first output signal line 310.

The plurality of shift register units are cascaded with each other and comprise a first shift register unit 410 and a plurality of second shift register units 420_1, . . . 420_n. The plurality of second shift register units 420_1, . . . 420_n are correspondingly connected to the plurality of second output signal lines 320_1, . . . 320_n. For example, the number of the second shift register units 420_1, . . . 420_n is equal to the number of the second output signal lines 320_1, . . . 320_n, so as to achieve a case where the second shift register units 420_1, . . . 420_n are connected in one-to-one correspondence to the second output signal lines 320_1, . . . 320_n. The first output signal line 310 corresponds to the first shift register unit 410 but is in a state of being disconnected to the first shift register unit 410. Here, "corresponds", for example, may indicate that the first output signal line 310 and the first shift register unit 410 may be in a connection state at a certain phase of the production process, and be disconnected from each other by cutting, peeling or the like in a certain subsequent phase.

Figure 2:
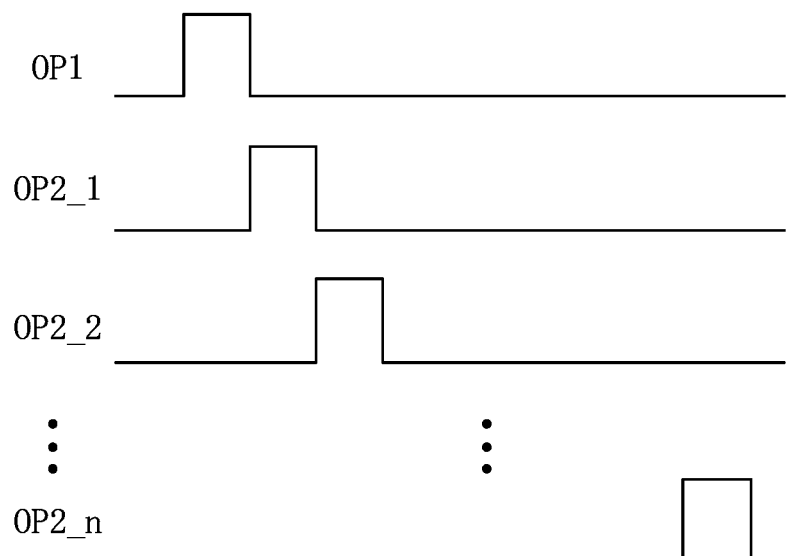
FIG. 2 is a timing diagram of output signals of a gate drive circuit according to some embodiments of the present disclosure.

The first output signal line 310 and the plurality of second output signal lines 320_1, . . . 320_n are configured to output a set of shift pulse signals. In a case where the gate drive circuit 10 comprises the repair signal generation circuit 100, the repair signal generation circuit 100 and the plurality of second shift register units 420_1, . . . 420_n are configured to output the set of shift pulse signals through the first output signal line 310 and the plurality of second output signal lines 320_1, . . . 320_n. For example, in an example, the timing of the set of shift pulse signals is illustrated in FIG. 2. OP1 is an output signal of the first output signal line 310, OP2_1, . . . OP2_n are output signals of the respective second shift register units 420_1, . . . 420_n, respectively. The set of shift pulse signals, for example, serves as scanning signals and is supplied to a plurality of rows of pixel units in the display panel, so as to implement progressive scanning, interlaced scanning or the like. It should be noted that, in the embodiments of the present disclosure, the set of shift pulse signals is not limited to the timing as illustrated in FIG. 2, and may be any applicable timing. For example, in some other examples, effective pulses of the respective signals are sequentially overlapped, so that the refresh frequency of the display panel driven by the set of shift pulse signals can be improved.

In this embodiment, for example, in an initial state (not illustrated in the drawing), the first shift register unit 410 is connected to the first output signal line 310, and performs output through the first output signal line 310. Here, "initial state" may refer to a certain phase of the production process, for example, a phase in which a semiconductor process (for example, the process is for preparing a GOA) is completed on an array substrate, or may also refer to a phase before the gate drive circuit 10 malfunctions during the use process by the user. For example, in this case, an output of the first shift register unit 410 is abnormal (for example, a pulse amplitude is lower or higher than an anticipative level, or a waveform is abnormal, etc.), and cannot satisfy the normal use requirements. Therefore, the first shift register unit 410 and the first output signal line 310 are disconnected, and then the first output signal line 310 and the repair signal line 200 are connected. Meanwhile, a waveform of the repair signal outputted by the repair signal generation circuit 100 is controlled to be coincident with that of the required shift pulse signal OP1, and the repair signal is transmitted to the first output signal line 310 through the repair signal line 200, so that the first output signal line 310 can output the normal shift pulse signal OP1.

In this way, the shift register unit (for example, the first shift register unit 410) outputting abnormally, can be isolated from the plurality of shift register units that are cascaded, and meanwhile the output of the shift pulse signal OP1 can be ensured, so as to help to improve product yield and improve maintenance efficiency. For example, before the display panel adopting the gate drive circuit 10 is shipped out, due to the influence of factors such as process accuracy and process stability, after the semiconductor process is completed, outputs of some shift register units may be abnormal, resulting in the entire gate drive circuit 10 being unusable. However, through the above-mentioned method, the abnormal shift register unit can be isolated, and in combination with the repair signal provided by the repair signal generation circuit 100, the gate drive circuit 10 can output a set of normal shift pulse signals, thereby avoiding the display panel adopting the gate drive circuit 10 being scrapped, increasing the yield of the product, and correspondingly reducing the manufacturing cost of the product. Moreover, the above-mentioned method is simple in operation and contributes to improving maintenance/repair efficiency.

For example, in the embodiments of the present disclosure, a shift register unit that is faulty is referred to as a first shift register unit, and the remaining shift register units are referred to as second shift register units. Correspondingly, an output signal line connected to the first shift register unit is referred to as a first output signal line, and an output signal line connected to a second shift register unit is referred to as a second output signal line. "First" and "second" are only used to distinguish whether the corresponding shift register unit has a fault or not, and do not indicate differences in structure, position, function and the like.

It should be noted that, in the embodiments of the present disclosure, a cascaded position of the first shift register unit 410 in the gate drive circuit 10 is not limited, and the first shift register unit 410 may be any one of the shift register units in the gate drive circuit 10. A case where the first shift register unit 410 is the first shift register unit is illustrated in FIG. 1, but the embodiments of the present disclosure is not limited thereto. Accordingly, a position of the first output signal line 310 corresponding to the first shift register unit 410 is also not limited, and the timing of the shift pulse signal OP1 in the set of shift pulse signals is also not limited. That is, in the gate drive circuit 10, the shift register unit that outputs abnormally and needs to be isolated may be any shift register unit. The waveform of the repair signal outputted by the repair signal generation circuit 100 can be the same as that of an output signal of any shift register unit, so that an overall repair of the gate drive circuit 10 can be achieved.

The number of the first shift register units 410, the number of the first output signal lines 310 and the number of the repair signal lines 200 are not limited, the gate drive circuit 10 may comprise a plurality of first shift register units 410, a plurality of first output signal lines 310 and a plurality of repair signal lines 200, as long as the number of the first shift register units 410, the number of the first output signal lines 310 and the number of the repair signal lines 200 are the same. For example, as illustrated in FIG. 1, the gate drive circuit 10 comprises one repair signal line 200, and the repair signal line 200 extends across each output signal line, so that any shift register unit can be isolated, and a corresponding shift pulse signal can be repaired. For example, in another example, the gate drive circuit 10 comprises a plurality of repair signal lines 200, and the plurality of repair signal lines 200 extend across each output signal line, so that an arbitrary plurality of shift register units can be isolated and a corresponding plurality of shift pulse signals can be repaired.

It should be noted that, in the embodiments of the present disclosure, the repair signal line 200 extends across each output signal line, but the specific cross manner is not limited, and can be determined according to the actual wiring mode, as long as it can be ensured that the repair signal line 200 has at least one intersection with each output signal line, so as to facilitate to isolate and repair any shift register unit.

It should be noted that, in the embodiments of the present disclosure, a cascaded relationship among the first shift register unit 410 and the plurality of second shift register units 420_1, . . . 420_n is not limited and may be any applicable cascaded relationship, and the cascaded relationship illustrated in FIG. 1 is merely illustrative, and is not limitative to the embodiments of the present disclosure. For example, when a certain shift register unit occur a faulty, resulting in that a cascade signal outputted to other shift register units is abnormal, isolation and repair can be performed through the above-described method. For example, a cascade signal line connected to the first shift register unit 410 may be disconnected from the first shift register unit 410, and then the cascade signal line is connected to the first output signal line 310, so as to receive the repair signal transmitted to the first output signal line 310 through the repair signal line 200. The repair signal is provided as a cascade signal to a next shift register unit so as to be used as a trigger signal, and the repair signal can also be provided to a previous shift register unit so as to be used as a reset signal.

Figure 3A:
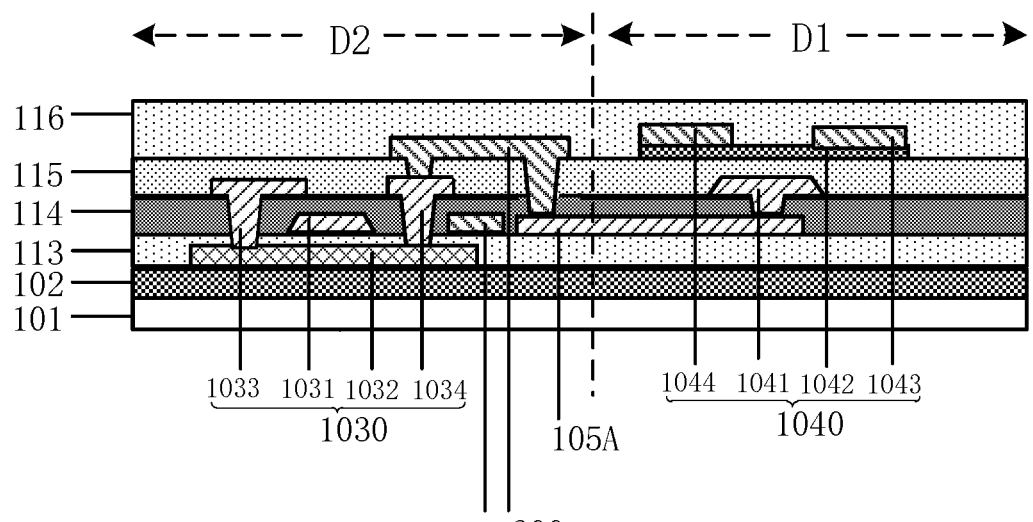
FIG. 3A is a schematic cross-sectional view of a layer structure of a gate drive circuit according to some embodiments of the present disclosure.

FIG. 3A is a schematic cross-sectional view of a layer structure of a gate drive circuit according to some embodiments of the present disclosure. The layer structure is, for example, an array substrate, and comprises a display area D1 and a peripheral area D2. The display area D1 comprises a pixel area corresponding to pixel units and other components such as gate lines 105A, data lines 105B (not illustrated in the drawing), and the like, and the pixel area comprises a first thin film transistor 1040. The peripheral area D2 comprises a second thin film transistor 1030. Here, a material of an active layer of the first thin film transistor 1040 and a material of an active layer of the second thin film transistor 1030 may be the same or different. For example, the peripheral area D2 comprises the gate drive circuit 10, the gate drive circuit 10 comprises a plurality of shift register units that are cascaded. Each shift register unit typically comprises a plurality of thin film transistors and a capacitor, and an output terminal of each shift register unit outputs a gate scanning signal. For example, in this embodiment, the second thin film transistor 1030 may be a transistor connected to the output terminal of the shift register unit in the gate drive circuit 10, that is, may be an output transistor. For example, each shift register unit is connected to a gate line 105A in the display area D1 to supply a gate scanning signal to the gate line 105A at a predetermined time.

Figure 3B:
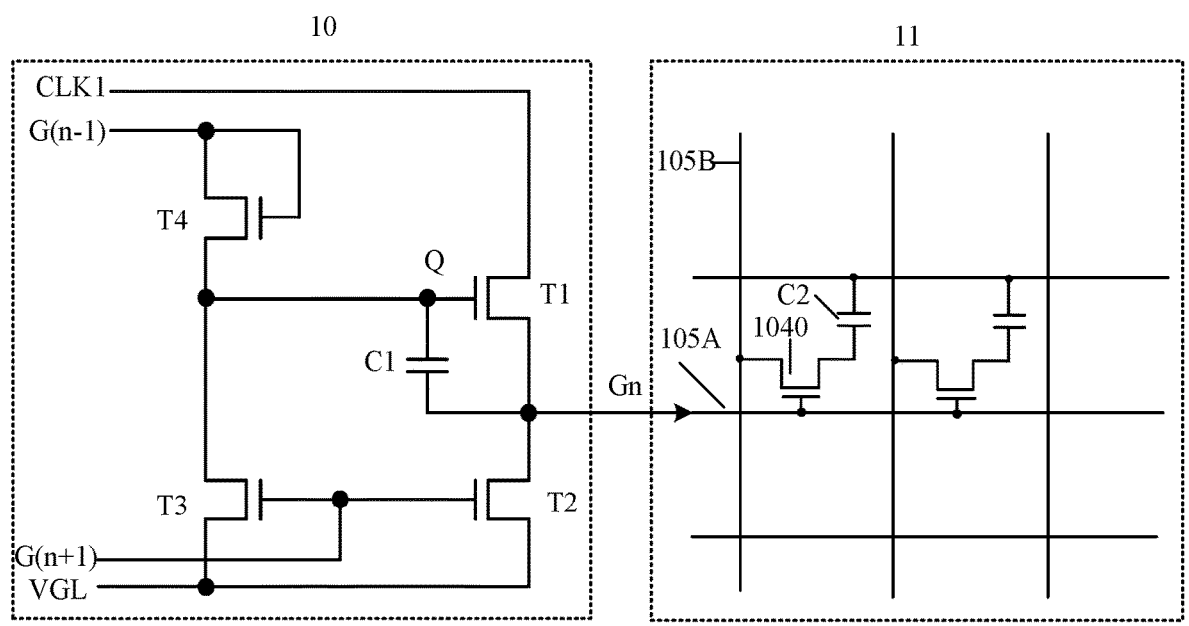
FIG. 3B is a circuit diagram of a specific implementation example of a shift register unit of a gate drive circuit.

For example, FIG. 3B is a circuit diagram of a specific implementation example of a shift register unit of a gate drive circuit. Referring to FIG. 3B, the gate drive circuit 10 and a pixel circuit 11 are both on a base substrate of the array substrate. The plurality of gate lines 105A and the plurality of data lines 105B are arranged in an array and cross each other to define a plurality of pixel units. Generally, each of the pixel units comprises at least one first thin film transistor 1040 and a pixel storage capacitor C2. The first thin film transistor 1040 functions as a switch element and is connected to a gate line 105A and a data line 105B respectively. The first thin film transistor 1040 applies a data signal supplied from the data line 105B to the pixel storage capacitor C2 under control of a gate scanning signal supplied from the gate line 105A, so as to charge the pixel storage capacitor C2, thereby controlling a light emitting element (not illustrated in the drawing) of the pixel unit to emit light. It should be noted that, FIG. 3B only illustrates some components in the pixel unit, and the connection manner of the some components is merely illustrative and not restrictive, and other components that are omitted may be referred to the common design and are not be described in detail herein.

FIG. 3B only illustrates the circuit structure of one shift register unit in the gate drive circuit 10, but does not constitute limitations to the embodiments of the present disclosure. For example, the shift register unit comprises a first transistor T1, a second transistor T2, a third transistor T3, a fourth transistor T4, and a storage capacitor C1.

The first transistor T1 is an output transistor, which is connected to the output terminal, of the shift register unit, that is, the first transistor T1 is the second thin film transistor 1030 in the peripheral area D2 as illustrated in FIG. 3A. For example, a first electrode of the first transistor T1 is connected to a first clock signal CLK1, a second electrode of the first transistor T1 is connected to a first electrode of the second transistor T2 and can output a gate scanning signal Gn (the gate scanning signal Gn is a square wave pulse signal, and correspondingly a pulse portion of the gate scanning signal Gn is a turn-on level, and a non-pulse portion of the gate scanning signal Gn is a turn-off level) and a trigger signal for a next shift register unit. A gate electrode of the first transistor T1 is connected to a pull-up node Q, thereby being connected to a first electrode of the third transistor T3 and a second electrode of the fourth transistor T4.

A second electrode of the second transistor T2 is connected to a second electrode of the third transistor T3 and a low level signal terminal VGL. A gate electrode of the second transistor T2 is connected to a gate electrode of the third transistor T3 and an output terminal of the next shift register unit (namely a (n+1)th shift register unit), to receive a gate scanning signal G(n+1) as an output pull-down control signal. The first electrode of the second transistor T2 is connected to the second electrode of the first transistor T1. Therefore, the second transistor T2 can be turned on under control of the pull-down control signal, and pulls an output signal of the output terminal to a low level in a case where the gate scanning signal Gn does not need to be output.

The first electrode of the third transistor T3 is connected to the pull-up node Q, thereby being electrically connected to the second electrode of the fourth transistor T4 and the gate electrode of the first transistor T1. The second electrode of the third transistor T3 is connected to the low level signal terminal VGL. The gate electrode of the third transistor T3 is also connected to the output terminal of the next shift register unit (namely a (n+1)th shift register unit), to receive the gate scanning signal G(n+1) as a reset control signal (which is also the output pull-down control signal). Therefore, the third transistor T3 can be turned on under control of the reset control signal to reset the pull-up node Q to a low level, thereby turning off the first transistor T1.

A first electrode of the fourth transistor T4 is connected to a gate electrode of the fourth transistor T4, and is connected to an output terminal of a previous shift register unit (namely a (n−1)th shift register unit) to receive a gate scanning signal G(n−1) as an input signal (a trigger signal), and the second electrode of the fourth transistor T4 is connected to the pull-up node Q, so that the pull-up node Q can be charged when the fourth transistor T4 is turned on, thus the level of the pull-up node Q can make the first transistor T1 be turned on, and therefore the first clock signal CLK1 is output through the output terminal. One terminal of the storage capacitor C1 is connected to the gate electrode of the first transistor T1, that is, the pull-up node Q, and the other terminal of the storage capacitor C1 is connected to the second electrode of the first transistor T1, so that the level of the pull-up node Q can be stored by the storage capacitor C1, and the level of the pull-up node Q can be further pulled up to improve the output performance due to an bootstrap effect of the storage capacitor C1 when the first transistor T1 is turned on to output.

When the gate drive circuit 10 is in operation, in a case where the gate scanning signal G(n−1) is at a high level, the fourth transistor T4 is turned on and the pull-up node Q is charged, and the level at which the pull-up node Q rises causes the first transistor T1 to be turned on, so that the first clock signal CLK1 can be outputted at the output terminal through the first transistor T1, that is, the gate scanning signal Gn is equal to the first clock signal CLK1. When the first clock signal CLK1 is at a high level, the gate scanning signal Gn also outputs a high level. When the gate scanning signal Gn is at a high level, the shift register unit of the gate drive circuit 10 inputs the high level signal Gn to a gate line 105A of a corresponding pixel unit row in the array substrate, so that the first thin film transistors 1040 of all pixel units corresponding to the gate line 105A are turned on. A data signal is input to the pixel storage capacitor C2 of a corresponding pixel unit through the first thin film transistor 1040 in the corresponding pixel unit via the data line 105B, to charge the pixel storage capacitor C2 in the corresponding pixel unit, thereby implementing that the signal voltage of the pixel unit is written and held. In a case where the gate scanning signal G(n+1) is at a high level, the second transistor T2 and the third transistor T3 are turned on, so as to achieve a function of pulling down the pull-up node Q and the output terminal. Therefore, through the gate drive circuit 10, for example, a progressive scanning function for pixel units arranged in a plurality of rows can be achieved.

Because a source electrode and a drain electrode of each of the above transistors are symmetrical, the source electrode and the drain electrode of the transistor can be interchanged. The first electrode can be, for example, the source electrode or the drain electrode, and the second electrode can be, for example, the drain electrode or the source electrode. For example, each of the above transistors may be an N-type transistor. Of course, the above respective transistors are not limited to be N-type transistors, and at least part of the above respective transistors may be P-type transistors, so long as a polarity of a corresponding signal is changed accordingly.

It should be noted that, in the embodiments of the present disclosure, a structure of the shift register unit of the gate drive circuit 10 is not limited to the circuit structure described above, and may be any suitable circuit structure, and the shift register unit of the gate drive circuit 10 may comprise more or less transistors and/or capacitors, and for example, circuits for implementing functions of pull-up node control, pull-down node control, noise reduction, and the like can be added, and the embodiments of the present disclosure do not limit the structure of the shift register unit.

For example, as illustrated in FIG. 3A, the first thin film transistor 1040 comprises a first gate electrode 1041, a first active layer 1042, a first source electrode 1043, a first drain electrode 1044 and the like; and the second thin film transistor 1030 comprises a second gate electrode 1031, a second active layer 1032, a second source electrode 1033, a second drain electrode 1034 and the like. For example, a position of the first source electrode 1043 of the first thin film transistor 1040 and a position of the first drain electrode 1044 of the first thin film transistor 1040 may be interchanged; and a position of the second source electrode 1033 of the second thin film transistor 1030 and a position of the second drain electrode 1034 of the second thin film transistor 1030 may be interchanged. The second gate electrode 1031 is electrically connected, for example, to the pull-up node Q in the shift register unit of the gate drive circuit 10, thereby achieving controlling the output signal.

For example, a material of the first active layer 1042 of the first thin film transistor 1040 comprises an oxide semiconductor material or an organic semiconductor material, and a material of the second active layer 1032 of the second thin film transistor 1030 comprises a polysilicon semiconductor material. For example, the oxide semiconductor material comprises a metal oxide semiconductor material (e.g., indium gallium zinc oxide), which is not limited in the embodiments of the present disclosure. The polysilicon semiconductor material comprises a low temperature polysilicon semiconductor material, a high temperature polysilicon semiconductor material, or the like, which is not limited in the embodiments of the present disclosure.

For example, as illustrated in FIG. 3A, the layer structure further comprises a base substrate 101 and an interlayer insulating layer 114 laminated on the base substrate 101, and the first thin film transistor 1040 and the second thin film transistor 1030 are formed in different layers on the base substrate 101. The base substrate 101 may be a glass substrate, a quartz substrate, a plastic substrate, or a substrate of other suitable materials. A material of the interlayer insulating layer 114 may be SiNx, SiOx, or other suitable materials, and the embodiments of the present disclosure are not limited thereto.

For example, as illustrated in FIG. 3A, relative to the base substrate 101, the first gate electrode 1041 and the first active layer 1042 of the first thin film transistor 1040 are both formed on the interlayer insulating layer 114, and the second gate electrode 1031 and the second active layer 1032 of the second thin film transistor 1030 are both formed between the interlayer insulating layer 114 and the base substrate 101. For example, the second drain electrode 1034 of the second thin film transistor 1030 is electrically connected to the first gate electrode 1041 of the first thin film transistor 1040, and the second source electrode 1033 and the second drain electrode 1034 of the second thin film transistor 1030 and the first gate electrode 1041 of the first thin film transistor 1040 are formed in the same layer. For example, the second drain electrode 1034 of the second thin film transistor 1030 is connected to the gate line 105A through an output signal line 300 (including the aforementioned first output signal line 310 and the plurality of second output signal lines 320_1, . . . 320_n), and is further electrically connected to the first gate electrode 1041 of the first thin film transistor 1040. For example, materials of the first gate electrode 1041, the first source electrode 1043, the first drain electrode 1044, the gate line 105A, the second gate electrode 1031, the second source electrode 1033, and the second drain electrode 1034 may include aluminum, aluminum alloy, copper, copper alloy or any other suitable materials, which is not limited in the embodiments of the present disclosure. For example, the first drain electrode 1044 of the first thin film transistor 1040 and the data line 105B (not illustrated in FIG. 3A) are electrically connected to each other or integrally formed with each other, and for example, the first drain electrode 1044 is a part of the data line 105B.

For example, the layer structure may further comprise a buffer layer 102, a first insulating layer 113, a second insulating layer 115, and a passivation layer 116.

The buffer layer 102 is, for example, on the base substrate 101. On one hand, the buffer layer 102 can prevent impurity ions in the base substrate 101 from being diffused into a circuit layer including the first thin film transistor 1040 and the second thin film transistor 1030 which are formed later, and prevent adverse effects on characteristics such as a threshold voltage and a leakage current of the first thin film transistor 1040 and a threshold voltage and a leakage current of the second thin film transistor 1030. On the other hand, the buffer layer 102 can also planarize a surface of the base substrate 101. A material of the buffer layer 102 may include SiNx, SiOx, or other suitable materials, and the embodiments of the present disclosure do not limit the material of the buffer layer 102.

For example, the first insulating layer 113 is on the buffer layer 102 and covers the second active layer 1032, so as to function as a gate insulating layer of the second thin film transistor 1030. A material of the first insulating layer 113 may comprise SiNx, SiOx, or other suitable materials, and the embodiments of the present disclosure do not limit the material of the first insulating layer 113.

For example, the second insulating layer 115 is on the interlayer insulating layer 114 and covers the second source electrode 1033, the second drain electrode 1034 and the first gate electrode 1041, so as to function as a gate insulating layer of the first thin film transistor 1040. A material of the second insulating layer 115 may comprise SiNx, SiOx, or other suitable materials, and the embodiments of the present disclosure do not limit the material of the second insulating layer 115.

For example, the passivation layer 116 is on the second insulating layer 115. For example, a material used for the passivation layer 116 may include an inorganic insulating material such as SiNx or SiOx, an organic insulating material such as an organic resin, or other suitable materials, and the embodiments of the present disclosure do not limit the material of the passivation layer 116.

For example, the repair signal line 200 is on the first insulating layer 113, and the repair signal line 200 and the second gate electrode 1031 are located in the same layer, that is, the repair signal line 200 and the second gate electrode 1031 can be formed by the same process. The output signal line 300 is on the second insulating layer 115, and the output signal line 300, the first source electrode 1043 and the first drain electrode 1044 are located in the same layer, that is, the output signal line 300, the first source electrode 1043 and the first drain electrode 1044 can be formed by the same process. In this way, the formation of the repair signal line 200 and the output signal line 300 can be achieved without adding a new process, thereby reducing production cost and improving production efficiency.

In this example, the repair signal line 200 and the output signal line 300 are located in different layers, so that in an initial state, the repair signal line 200 and the output signal line 300 are insulated from each other. In a case where a certain shift register unit outputs abnormally, the certain shift register unit and the output signal line 300 connected to the certain shift register unit are disconnected by laser cutting or peeling, and then the repair signal line 200 and the output signal line 300 are connected, thereby implementing a change in a connection state, thus a repair function can be implemented by cooperating with the repair signal generation circuit 100. For example, the repair signal line 200 and the output signal line 300 may be broken by the laser at an intersection of the repair signal line 200 and the output signal line 300, and then the repair signal line 200 and the output signal line 300 are soldered at the intersection.

It should be noted that, in the embodiments of the present disclosure, specific setting positions of the repair signal line 200 and the output signal line 300 are not limited, may be determined according to the process sequence and the panel structure, and are not limited in the manner as illustrated in FIG. 3A. The repair signal line 200 and the second gate electrode 1031 may be located in the same layer, the repair signal line 200 may be in the same layer as other components, or may be located in a separate layer. Similarly, the output signal line 300 can be in the same layer as the first source electrode 1043 and the first drain electrode 1044, may also be located in the same layer as other components, or may be located in a separate layer. The layer structure can comprise more or fewer components, and the relative positional relationship of the components is not limited and may be determined according to the actual needs.

Figure 4:
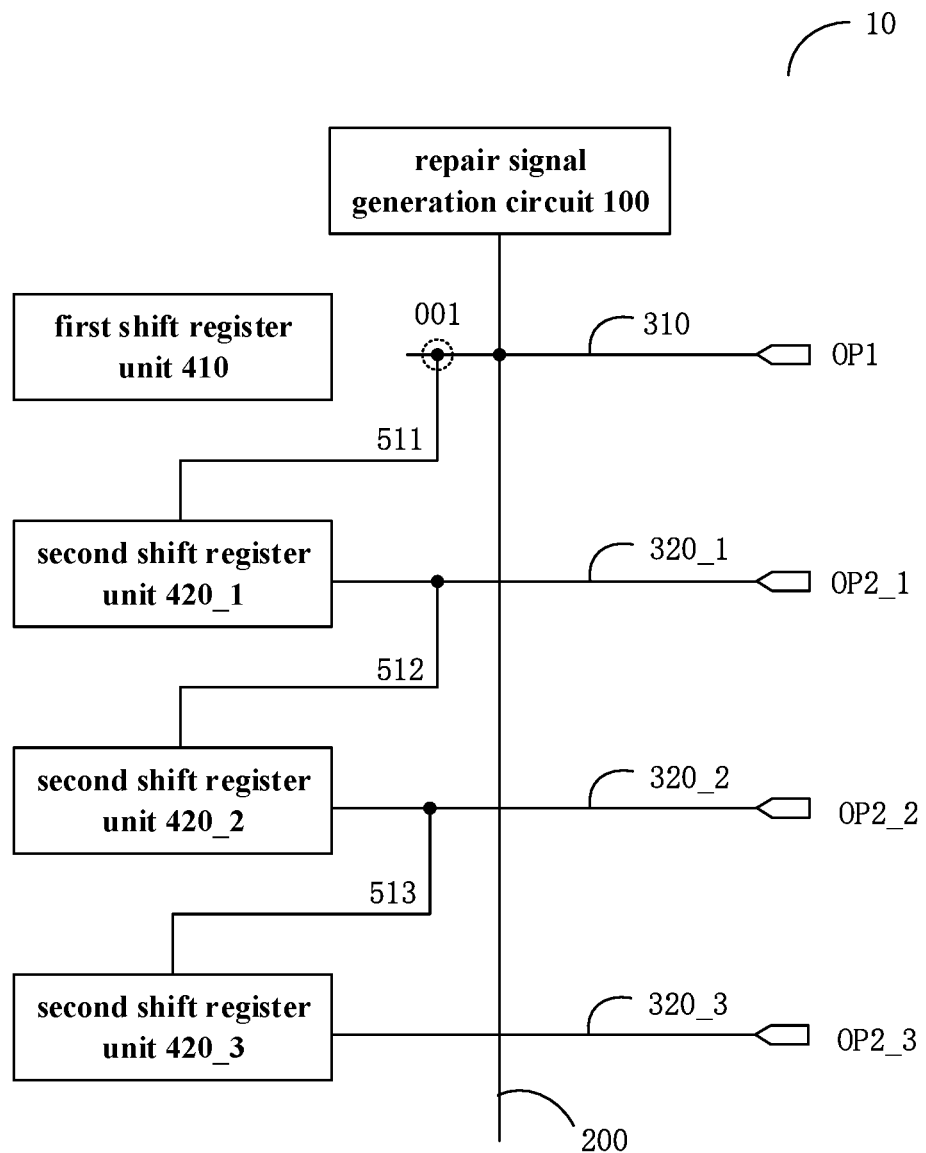
FIG. 4 is a schematic block diagram of another gate drive circuit according to some embodiments of the present disclosure.

FIG. 4 is a schematic block diagram of another gate drive circuit according to some embodiments of the present disclosure. Referring to FIG. 4, a gate drive circuit 10 of this embodiment is substantially the same as the gate drive circuit 10 as illustrated in FIG. 1 except that a plurality of cascade signal lines 511-513 are further included. It should be noted that, this embodiment is described by taking a case where the number of the second shift register units is three as an example, and accordingly, the number of the cascade signal lines 511-513 are also three, but the embodiments of the present disclosure are not limited thereto.

In this embodiment, the first output signal line 310 is connected to a next second shift register unit 420_1 adjacent to the first shift register unit 410 through a cascade signal line 511 which corresponds to but is in a state of being disconnected to the first shift register unit 410, and is configured to transmit the repair signal as a trigger signal to the adjacent next second shift register unit 420_1. For example, in the gate drive circuit 10, an output signal of each shift register unit is outputted to a corresponding pixel unit through an output signal line, and is also outputted as a trigger signal to a next shift register unit. In a case where the first shift register unit 410 outputs abnormally, the repair signal provided by the repair signal generation circuit 100 is transmitted to the adjacent second shift register unit 420_1 through the repair signal line 200, the first output signal line 310, and the cascade signal line 511, thereby providing a correct trigger signal for the adjacent second shift register unit 420_1, so as to make the subsequent respective shift register units operate normally. Here, "corresponds" may mean, for example, that the cascade signal line 511 and the first shift register unit 410 may be connected to each other through the first output signal line 310 at a certain phase of the production process, and may be disconnected from each other in a subsequent phase due to cutting or peeling the first output signal line 310.

It should be noted that, in the embodiments of the present disclosure, a cascaded mode of the respective shift register units is not limited. For example, in another example, the first shift register unit 410 may be connected to the second shift register unit 420_2 which is separated apart the first shift register unit 410 by the second shift register unit 420_1, and the second shift register unit 420_1 and the second shift register unit 420_3 are connected, that is, the second shift register unit 420_1 is between the first shift register unit 410 and the second shift register unit 420_2. At this time, it needs to be ensure that the repair signal can be transmitted to a corresponding shift register unit through a corresponding cascade signal line.

It should be noted that, in the embodiments of the present disclosure, the number of the cascade signal lines connected to each shift register unit is not limited and may be determined according to actual needs. For example, in an example, one cascade signal line is connected to each shift register unit, so that the cascade signal line is configured to provide a trigger signal for the next shift register unit. For example, in another example, a plurality of cascade signal lines are connected to each shift register unit, so that the plurality of cascade signal lines are configured to respectively provide a trigger signal, a reset signal, and the like.

For example, in order to facilitate to disconnect the first shift register unit 410 and the first output signal line 310 without affecting the connection relationship between the first output signal line 310 and the corresponding cascade signal line 511, a connection point 001 of the first output signal line 310 and the corresponding cascade signal line 511 may be located at a position which is as far as possible from the first shift register unit 410 when wiring, thereby providing sufficient space for the cutting operation, and ensuring that the first output signal line 310 and the corresponding cascade signal line 511 are not disconnected due to an erroneous operation. For example, the plurality of cascade signal lines 511-513 and the plurality of output signal lines 310, 320_1-320_3 are located in the same layer.

Figure 5:
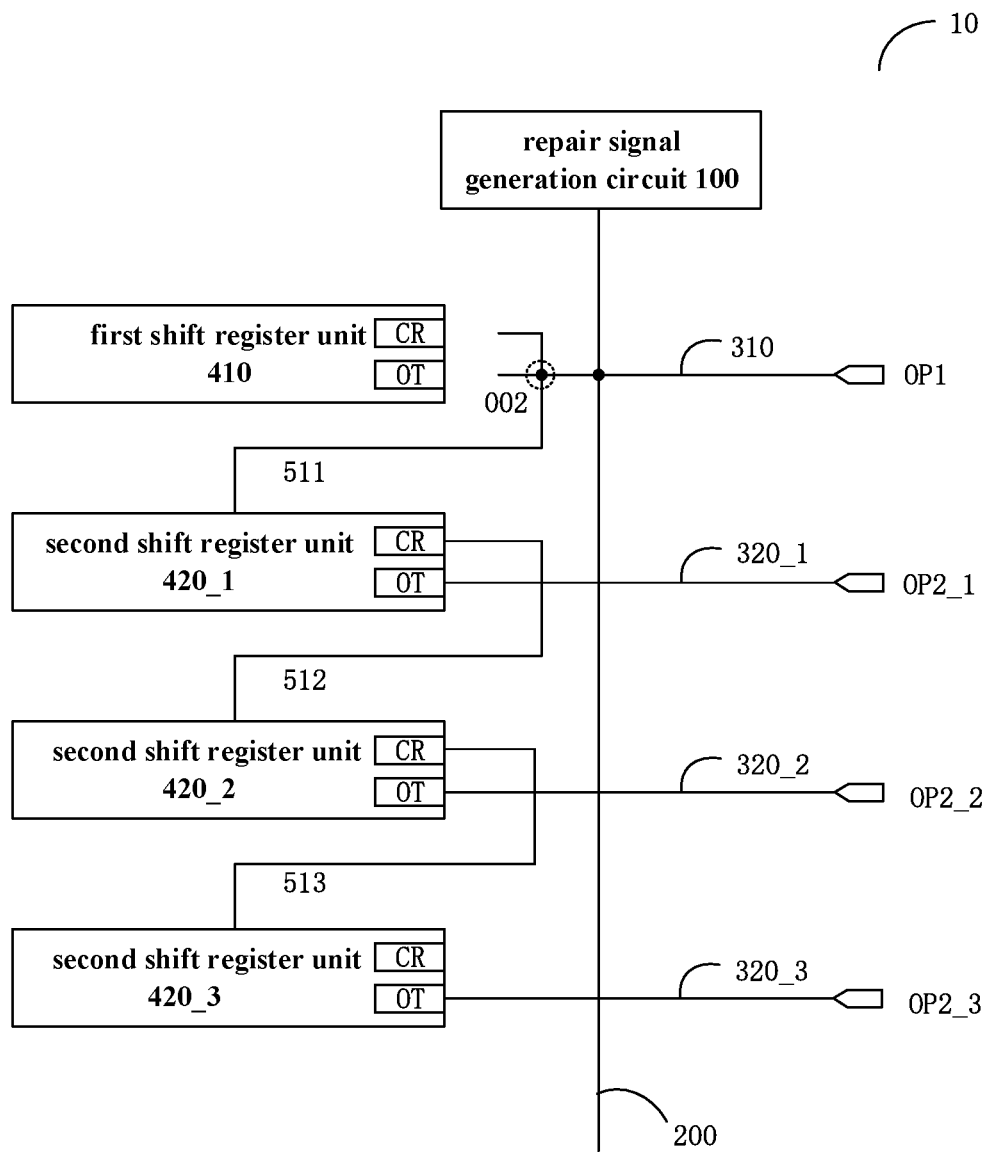
FIG. 5 is a schematic block diagram of still another gate drive circuit according to some embodiments of the present disclosure.

FIG. 5 is a schematic block diagram of still another gate drive circuit according to some embodiments of the present disclosure. Referring to FIG. 5, a gate drive circuit 10 of this embodiment is substantially the same as the gate drive circuit 10 as illustrated in FIG. 4 except that a connection mode of the plurality of cascade signal lines 511-513 is different from that of the gate drive circuit 10 as illustrated in FIG. 4.

In this embodiment, each shift register unit comprises a trigger signal output terminal CR and a pixel scanning signal output terminal OT. For example, when the shift register unit operates normally, a signal output from the trigger signal output terminal CR and a signal output from the pixel scanning signal output terminal OT are the same. The first output signal line 310 is connected to both the repair signal line 200 and the cascade signal line 511 which corresponds to but is in a state of being disconnected to the first shift register unit 410. Here, "corresponds" may mean, for example, that the cascade signal line 511 and the first shift register unit 410 may be connected to each other at a certain phase of the production process, and may be disconnected from each other by cutting, peeling or the like in a subsequent phase.

A trigger signal output terminal CR of the first shift register unit 410 and the corresponding cascade signal line 511 are not connected. Pixel scanning signal output terminals OT of the second shift register units 420_1, 420_2 and 420_3 are correspondingly connected (for example, connected in one-to-one correspondence) to the second output signal lines 320_1, 320_2 and 320_3, and trigger signal output terminals CR of the second shift register units 420_1 and 420_2 are correspondingly connected (for example, connected in one-to-one correspondence) to the cascade signal lines 512 and 513.

In this embodiment, for example, in an initial state (not illustrated in the drawing), the trigger signal output terminal CR of the first shift register unit 410 is connected to the cascade signal line 511, and a pixel scanning signal output terminal OT of the first shift register unit 410 is connected to the first output signal line 310. For example, at this time, an output of the first shift register unit 410 is abnormal, which is unable to satisfy the normal usage requirements. Therefore, the first shift register unit 410 is disconnected from both the cascade signal line 511 and the first output signal line 310, the first output signal line 310 and the repair signal line 200 are connected to each other, and the cascade signal line 511 and the first output signal line 310 are connected to each other. Meanwhile, a waveform of the repair signal outputted by the repair signal generation circuit 100 is controlled to be coincident with that of the required shift pulse signal OP1, and the repair signal is transmitted to the first output signal line 310 through the repair signal line 200, and then transmitted to the cascade signal line 511, so that the first output signal line 310 can output a normal shift pulse signal OP1, and provide a normal trigger signal for the next shift register unit (e.g., the second shift register unit 420_1).

In this way, the shift register unit (for example, the first shift register unit 410), an output of which is abnormal, can be isolated, and meanwhile the output of the shift pulse signal OP1 can be ensured, so as to help to improve product yield and improve maintenance efficiency.

It should be noted that, in the embodiments of the present disclosure, in order to facilitate to disconnect the first shift register unit 410 and the cascade signal line 511, and to connect the cascade signal line 511 and the first output signal line 310, when wiring, the cascade signal line 511 and the first output signal line 310 may have at least one intersection 002, and the intersection 002 is located at a position which is as far as possible from the first shift register unit 410, thereby facilitating to connect the cascade signal line 511 and the first output signal line 310 at the intersection 002 and providing sufficient space for the cutting operation.

For example, the plurality of cascade signal lines 511-513 and the repair signal line 200 are in the same layer, and the plurality of cascade signal lines 511-513 are in the layer which is different from a layer where the plurality of output signal lines 310, 320_1-320_3 are located, thereby reducing production cost. For example, the plurality of cascade signal lines 511-513 may be on the first insulating layer 113 as illustrated in FIG. 3A. Of course, the embodiments of the present disclosure are not limited thereto, and the plurality of cascade signal lines 511-513 may also be disposed in other suitable locations, which can be determined according to actual needs.

It should be noted that, in the embodiments of the present disclosure, both the first output signal line 310 and the corresponding cascade signal line 511 may be disconnected from the first shift register unit 410, or only one of the first output signal line 310 and the corresponding cascade signal line 511 may be disconnected from the first shift register unit 410. Accordingly, both the repair signal line 200 and the cascade signal line 511 may be connected to the first output signal line 310, or only the repair signal line 200 may be connected to the first output signal line 310. For example, in an example, the pixel scanning signal output terminal OT of the first shift register unit 410 outputs abnormally, and the trigger signal output terminal CR thereof outputs normally. Therefore, only the first output signal line 310 is disconnected from the first shift register unit 410, and then the first output signal line 310 and the repair signal line 200 are connected, and the cascade signal line 511 is maintained to be connected to the first shift register unit 410. In this way, targeted maintenance can be carried out according to the actual abnormal situation, so as to reduce the maintenance workload and improve the maintenance efficiency.

Figure 6:
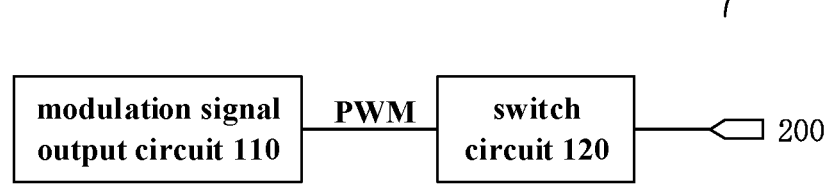
FIG. 6 is a schematic block diagram of a repair signal generation circuit of a gate drive circuit according to some embodiments of the present disclosure.

FIG. 6 is a schematic block diagram of a repair signal generation circuit of a gate drive circuit according to some embodiments of the present disclosure. Referring to FIG. 6, the repair signal generation circuit 100 comprises a modulation signal output circuit 110 and a switch circuit 120 which are electrically connected to each other. The modulation signal output circuit 110 is configured to output a modulation signal PWM to the switch circuit 120. The switch circuit 120 is configured to receive the modulation signal PWM and control whether the modulation signal PWM passes through the switch circuit 120 or not, to output the modulation signal PWM passing through the switch circuit 120 as the repair signal to the repair signal line 200. For example, in an example, the modulation signal PWM is a continuous high level signal, the switch circuit 120 can control the transit time of the high level signal to generate a desired pulse waveform and output the desired pulse waveform to the repair signal line 200. In a case where the first shift register unit 410 outputs abnormally, according to the cascaded position of the first shift register unit 410 in the gate drive circuit 10 and the signal timing, the waveform and timing of the repair signal are manually set, thereby achieving the repair of any shift register unit, for example, a waveform, that is the same as the output waveform of this shift register unit when this shift register unit is not damaged, is set. The above circuit has a simple structure, can be fabricated on an array substrate or integrated into a chip located outside the array substrate, and is easy to implement.

It should be noted that, in the embodiments of the present disclosure, the repair signal generation circuit 100 may have any implementation. For example, in another example, the repair signal generation circuit 100 may be implemented as a third shift register unit. The third shift register unit is identical in circuit structure to the first shift register unit 410 and the second shift register units 420_1, . . . 420_n, and is configured to generate a shift pulse signal OP1 corresponding to the first shift register unit 410 in a set of shift pulse signals, and to output the shift pulse signal OP1 as the repair signal. In a case where the first shift register unit 410 outputs abnormally, the cascade signal line 511 and the first output signal line 310, which correspond to the first shift register unit 410, are disconnected from the first shift register unit 410, and the third shift register unit is controlled to output a signal to the cascade signal line 511 and the first output signal line 310 through the repair signal line 200, thereby achieving repair. Of course, the third shift register unit may also be connected to a separately provided clock signal line, a separately provided reset signal line or the like, so as to be cascaded with the plurality of second shift register units 420_1, . . . 420_n into a complete gate drive circuit, thereby implementing the corresponding function. In this way, the waveform and timing of the repair signal do not need to be set manually, and it is only needed to connect the corresponding signal lines, so that the third shift register unit can output a signal corresponding to the first shift register unit 410 at any cascaded position, so as to simplify the control mode.

Figure 7:
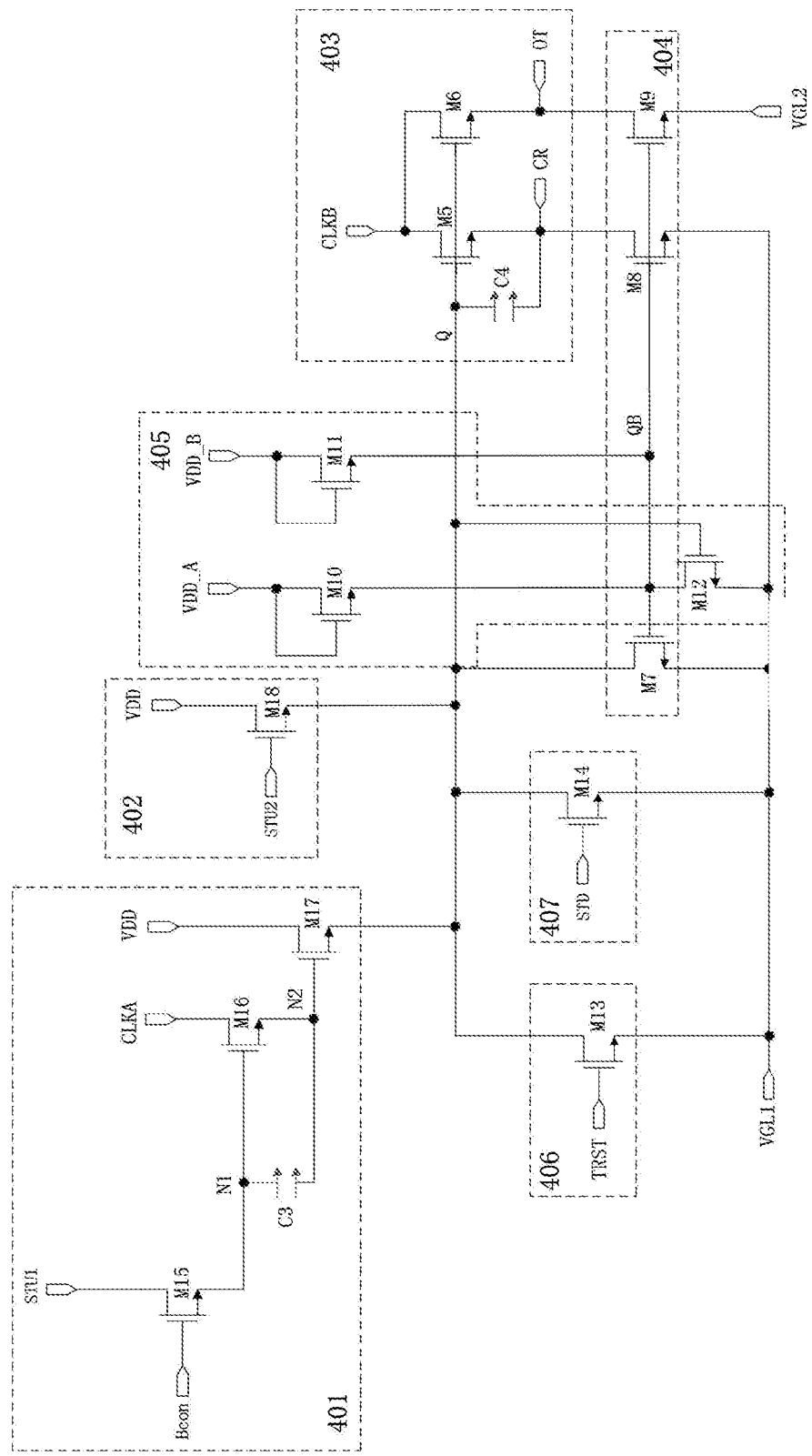
FIG. 7 is a circuit diagram of a specific implementation example of a shift register unit of a gate drive circuit according to some embodiments of the present disclosure.

FIG. 7 is a circuit diagram of a specific implementation example of a shift register unit of a gate drive circuit according to some embodiments of the present disclosure. The first shift register unit 410 and the plurality of second shift register units 420_1, . . . 420_n may all be implemented as the circuit structure. Referring to FIG. 7, a shift register unit comprises a blanking input circuit 401, a display input circuit 402, an output circuit 403, a first control circuit 404, a second control circuit 405, a blanking reset circuit 406 and a display reset circuit 407.

The blanking input circuit 401 is connected to a first node, and is configured to input a blanking pull-up signal to the first node, according to a blanking input signal and a blanking control signal, during a blanking period. For example, in this embodiment, the first node is a pull-up node Q. The display input circuit 402 is connected to the first node, and is configured to input a display pull-up signal to the first node (the pull-up node Q) in response to a display input signal during a display period. The output circuit 403 is connected to the first node, and is configured to output a composite output signal to an output terminal under control of a level of the first node (the pull-up node Q). For example, the output terminal comprises a trigger signal output terminal CR and a pixel scanning signal output terminal OT. The first control circuit 404 is connected to the first node and a second node, and is configured to perform noise reduction on the first node (the pull-up node Q) and the output terminal under control of a level of the second node. For example, in this embodiment, the second node is a pull-down node QB. The second control circuit 405 is connected to the first node and the second node, and is configured to control the level of the second node (the pull-down node QB) under control of the level of the first node (the pull-up node Q). The blanking reset circuit 406 is configured to reset the first node (the pull-up node Q) in response to a blanking reset signal. The display reset circuit 407 is configured to reset the first node (the pull-up node Q) in response to a display reset signal.

For example, the shift register unit can be implemented as fifth to eighteenth transistors M5-M18, a third capacitor C3, and a fourth capacitor C4. The fifth transistor M5 and the sixth transistor M6 output the composite output signal CLKB to the trigger signal output terminal CR and the pixel scanning signal output terminal OT respectively under control of the level of the pull-up node Q. When the shift register unit is the first shift register unit 410, the trigger signal output terminal CR and the pixel scanning signal output terminal OT are not connected to any signal line. When the shift register unit is the second shift register unit 420_1, the second shift register unit 420_2, or the second shift register unit 420_3, the trigger signal output terminal CR is connected to a corresponding cascade signal line 512 or 513, and the pixel scanning signal output terminal OT is connected to a corresponding second output signal line 320_1, 320_2 or 320_3. The working principle of the shift register unit can be referred to a conventional design, and details are not described herein again.

At least one embodiment of the present disclosure also provides a method of driving the gate drive circuit according to any one of the embodiments of the present disclosure. By using the method, an abnormal shift register unit can be isolated, and the output of the shift pulse signal can be ensured, so as to help to improve product yield, improve maintenance efficiency, and reduce product manufacture cost.

For example, the gate drive circuit adopting the method is the gate drive circuit 10 as illustrated in FIG. 1, FIG. 4 or FIG. 5. For example, in an example, the method comprises:

controlling the plurality of shift register units 410, 420_1, . . . 420_n that are cascaded to sequentially output; and in a case where the first shift register unit 410 outputs, outputting the repair signal to the repair signal line 200, so that the first output signal line 310 outputs the repair signal.

For example, in a case where the gate drive circuit 10 comprises the repair signal generation circuit 100, the repair signal generation circuit 100 can output the repair signal to the repair signal line 200. The repair signal generation circuit 100 and the plurality of second shift register units 420_1, . . . 420_n output a set of shift pulse signals through the first output signal line 310 and the plurality of second output signal lines 320_1, . . . 320_n. For a detailed description and a technical effect of the method, reference may be made to the corresponding description of the gate drive circuit 10 in the embodiments of the present disclosure, and details are not described herein again.

At least one embodiment of the present disclosure further provides a gate drive circuit, and the gate drive circuit comprises a repair signal line, a plurality of output signal lines, and a plurality of shift register units that are cascaded. The repair signal line is configured to receive a repair signal or a first voltage; the plurality of shift register units are correspondingly connected to the plurality of output signal lines, and are configured to output a set of shift pulse signals through the plurality of output signal lines; and the repair signal line and the plurality of output signal lines are insulated from each other, and the repair signal line extends across the plurality of output signal lines. For example, when a user uses a display device including the gate drive circuit, and the gate drive circuit goes wrong, the gate drive circuit can be quickly repaired. The gate drive circuit can isolate the abnormal shift register unit while ensuring the output of the shift pulse signal, so as to help to improve maintenance efficiency and simplify the maintenance method.

Figure 8:
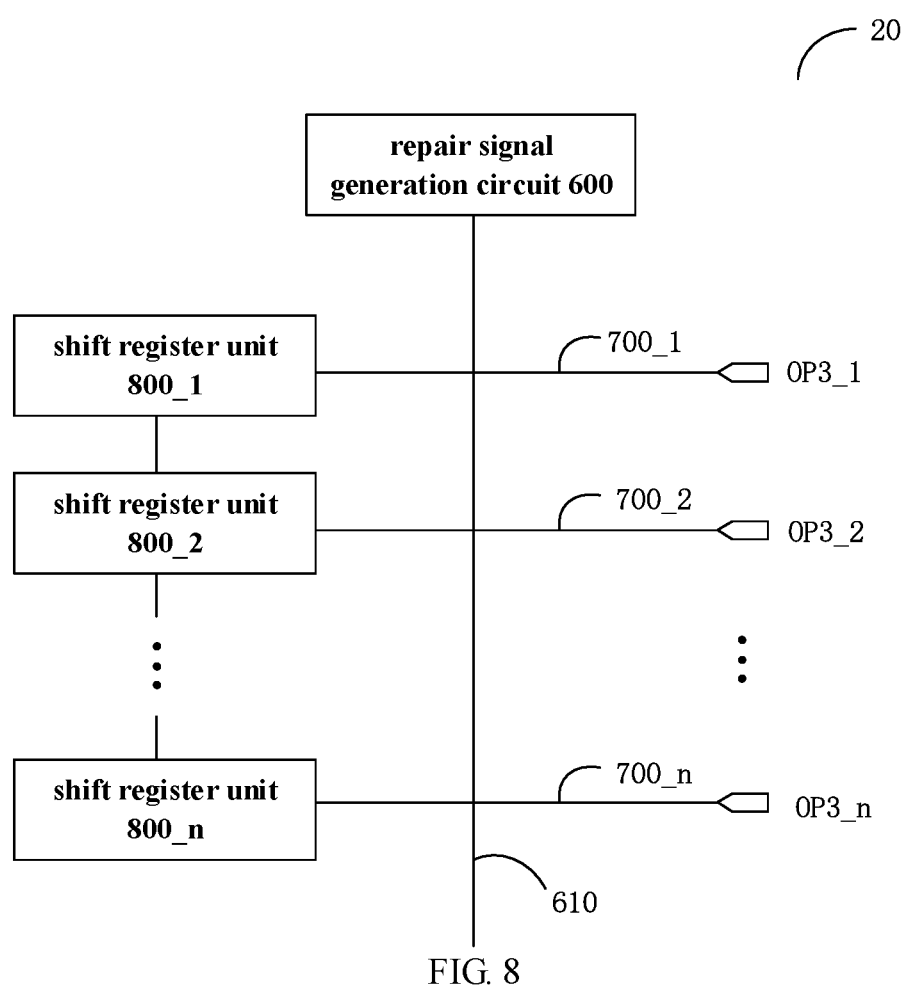
FIG. 8 is a schematic block diagram of a gate drive circuit according to some embodiments of the present disclosure.

FIG. 8 is a schematic block diagram of a gate drive circuit according to some embodiments of the present disclosure. Referring to FIG. 8, a gate drive circuit 20 comprises a repair signal line 610, a plurality of output signal lines 700_1, 700_2, . . . 700_n, and a plurality of shift register units 800_1, 800_2, . . . 800_n that are cascaded. For example, in some examples, the gate drive circuit 20 further comprises a repair signal generation circuit 600.

The repair signal line 610 is configured to receive a repair signal or a first voltage. For example, in a case where the gate drive circuit 20 comprises the repair signal generation circuit 600, the repair signal generation circuit 600 is connected to the repair signal line 610, and is configured to output the repair signal or the first voltage to the repair signal line 610. For example, the first voltage is a direct-current low level signal or a non-operating level signal of the gate drive circuit 20, such as ground. For example, a waveform and timing of the repair signal can be adjusted to meet the needs of the actual applications. The repair signal generation circuit 600 can be implemented as a circuit comprising a plurality of thin film transistors, can be implemented in any form of analog or digital circuits, or can be integrated into a chip located outside the array substrate, and the embodiments of the present disclosure are not limited thereto.

The plurality of shift register units 800_1, 800_2, . . . 800_n are cascaded with each other, and are correspondingly connected to the plurality of output signal lines 700_1, 700_2, . . . 700_n. For example, the plurality of shift register units 800_1, 800_2, . . . 800_n are connected in one-to-one correspondence to the plurality of output signal lines 700_1, 700_2, . . . 700_n. The plurality of shift register units 800_1, 800_2, . . . 800_n are configured to output a set of shift pulse signals through the plurality of output signal lines 700_1, 700_2, . . . 700_n. The set of shift pulse signals is provided, for example, to a plurality of rows of pixel units in a display panel to implement progressive scanning, interlaced scanning, or the like.

The repair signal line 610 and the plurality of output signal lines 700_1, 700_2, . . . 700_n are insulated from each other, the repair signal line 610 extends across the plurality of output signal lines 700_1, 700_2, . . . 700_n, and the repair signal line 610 has at least one intersection with each of the plurality of output signal lines. For example, the repair signal line 610 is in a layer which is different from a layer where the plurality of output signal lines 700_1, 700_2, . . . 700_n are located, and a setting manner of the repair signal line 610 and the plurality of output signal lines 700_1, 700_2, . . . 700_n can be referred to the embodiment as illustrated in FIG. 3A, and details are not described herein again.

For example, in the gate drive circuit 20, each of the shift register units 800_1, 800_2, . . . 800_n operates normally. The repair signal generation circuit 600 outputs the first voltage to the repair signal line 610. During a usage process, the first voltage is maintained to be provided to the repair signal line 610 when no fault occurs, so as to avoid interfering with the shift pulse signals output by the plurality of output signal lines 700_1, 700_2, . . . 700_n. In a case where a certain shift register unit outputs abnormally, when performing maintenance, the output signal line connected to the certain shift register unit can be disconnected, and the output signal line is connected to the repair signal line 610. Meanwhile, the repair signal generation circuit 600 outputs the repair signal, and the waveform of the repair signal coincides with that of the required shift pulse signal. The repair signal is transmitted to the output signal line through the repair signal line 610, so that the output signal line can output a normal shift pulse signal. For a detailed description of the repair operation, reference may be made to the above description of the gate drive circuit 10, and details are not described herein again.

In this way, the shift register unit, an output of which is abnormal, can be isolated, and meanwhile the output of the shift pulse signal can be ensured, so as to help to improve maintenance efficiency and simplify the maintenance method. For example, after the display panel adopting the gate drive circuit 20 is shipped out, during the time when the user uses the display panel, due to factors such as aging of the device and long-time operation, some shift register units may output abnormally, resulting in that the entire gate drive circuit 20 cannot operate normally. When performing maintenance, the abnormal shift register unit and the output signal line connected thereto may be disconnected, and then the output signal line is connected to the repair signal line 610, and meanwhile, the repair signal generation circuit 600 outputs the repair signal having a desired waveform and timing, so that the maintenance of the gate drive circuit 20 can be implemented, and the display panel adopting the gate drive circuit 20 can works again.

It should be noted that, in the embodiments of the present disclosure, the number of the repair signal lines 610 is not limited and may be one or more, so as to achieve isolation and repair of one or more abnormal shift register units. The repair signal line 610 extends across each output signal line, but the specific intersection manner is not limited, and may be determined according to the actual wiring manner, as long as it can be ensured that the repair signal line 610 has at least one intersection with each of the output signal lines, in order to isolate and repair any of the shift register units.

It should be noted that, in the embodiments of the present disclosure, a cascaded relationship among the plurality of shift register units 800_1, 800_2, . . . 800_n is not limited, and may be any applicable cascaded manner, and the cascaded manner as illustrated in FIG. 8 is merely illustrative and not limitative to the embodiments of the present disclosure. For example, when a certain shift register unit goes wrong, causing that a cascade signal (such as a trigger signal) output to other shift register units is abnormal, the above-mentioned method can also be used to isolate and repair the certain shift register unit. For example, the abnormal shift register unit can be disconnected from the cascade signal line connected thereto, and the cascade signal line can be connected to the corresponding output signal line, to receive the repair signal transmitted to the output signal line through the repair signal line 610, and provide the repair signal to the next shift register unit as a trigger signal.

Figure 9:
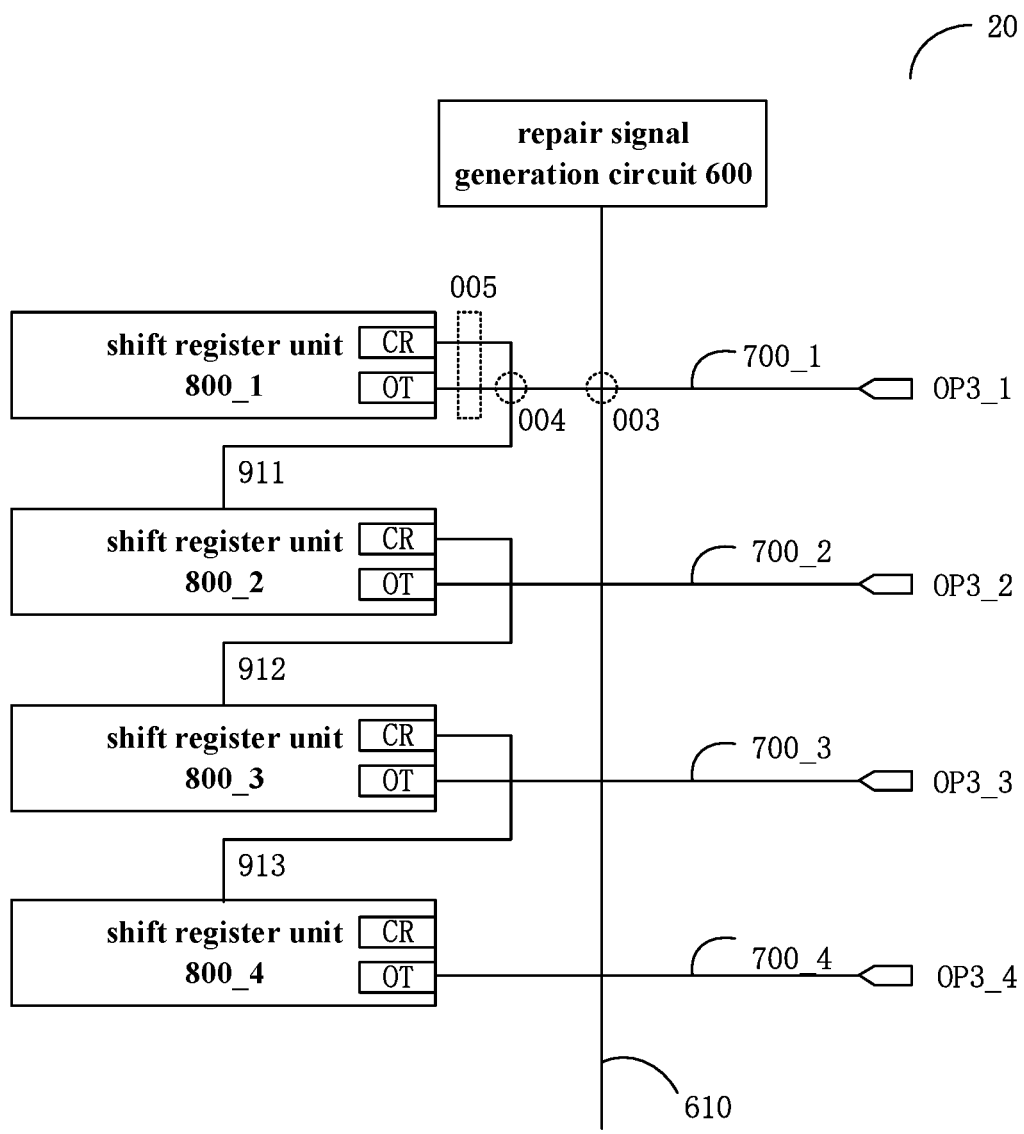
FIG. 9 is a schematic block diagram of another gate drive circuit according to some embodiments of the present disclosure.

FIG. 9 is a schematic block diagram of another gate drive circuit according to some embodiments of the present disclosure. Referring to FIG. 9, the gate drive circuit 20 further comprises a plurality of cascade signal lines 911-913. It should be noted that, this embodiment is described by taking a case where the number of the shift register units is four as an example, and accordingly, the number of the cascade signal lines 911-913 is three, but the embodiments of the present disclosure are not limited thereto.

For example, each shift register unit comprises a trigger signal output terminal CR and a pixel scanning signal output terminal OT. The pixel scanning signal output terminal OT is correspondingly connected to the output signal line, and the trigger signal output terminal CR is correspondingly connected to the cascade signal line. For example, the plurality of cascade signal lines 911-913 and the repair signal line 610 are in the same layer, and the plurality of cascade signal lines 911-913 are in the layer which is different from a layer where the plurality of output signal lines 700_1-700_4 are located. The cascade signal line and the output signal line, which are connected to the same shift register unit, are insulated from each other, and extend across each other. It should be noted that, in the embodiments of the present disclosure, the wiring manner of the plurality of cascade signal lines 911-913 is not limited, so long as it is ensured that each of the cascade signal lines has at least one intersection with the corresponding output signal line, so as to facilitate to connect the cascade signal line and the corresponding output signal line at the intersection during the maintenance process.

For example, in an example, during the usage process, the pixel scanning signal output terminal OT of a certain shift register unit (such as the shift register unit 800_1) outputs abnormally. When performing maintenance, the output signal line 700_1 corresponding to the certain shift register unit is disconnected from the certain shift register unit by cutting or peeling, and then the output signal line 700_1 and the repair signal line 610 are connected at an intersection 003 of the output signal line 700_1 and the repair signal line 610, and meanwhile, the repair signal generation circuit 600 outputs a corresponding repair signal. Here, in this case, the trigger signal output terminal CR outputs normally, so the cascade signal line 911 connected to the shift register unit 800_1 does not need to be modified.

For example, in another example, during the usage process, the pixel scanning signal output terminal OT and the trigger signal output terminal CR of the shift register unit 800_1 are both abnormal. Therefore, when performing maintenance, the corresponding output signal line 700_1 and the cascade signal line 911 are disconnected from the shift register unit 800_1, and the output signal line 700_1 and the repair signal line 610 are connected at the intersection 003 of the output signal line 700_1 and the repair signal line 610, the cascade signal line 911 and the output signal line 700_1 are connected at an intersection 004 of the output signal line 700_1 and the cascade signal line 911, and meanwhile, the repair signal generation circuit 600 outputs a corresponding repair signal. For example, when performing wiring in the production process, the intersection 004 of the cascade signal line 911 and the output signal line 700_1 may be located at a position which is as far as possible from the shift register unit 800_1, and the intersection 003 of the output signal line 700_1 and the repair signal line 610 may be located at a position which is as far as possible from the shift register unit 800_1 as well, thereby providing sufficient space for the cutting operation. For example, when performing maintenance, the output signal line 700_1 and the cascade signal line 911 may be disconnected from each other in a cutting area 005, the cascade signal line 911 and the output signal line 700_1 are connected to each other at the intersection 004, and the output signal line 700_1 and the repair signal line 610 are connected to each other at the intersection 003.

At least one embodiment of the present disclosure further provides a method of driving the gate drive circuit according to any one of the embodiments of the present disclosure. By using the method, the abnormal shift register unit can be isolated, and the output of the shift pulse signal can be ensured, so as to help to improve maintenance efficiency and simplify the maintenance method.

For example, the gate drive circuit adopting the method is the gate drive circuit 20 as illustrated in FIG. 8 or FIG. 9. For example, in an example, the method comprises:

controlling the plurality of shift register units 800_1, . . . 800_n that are cascaded to sequentially output, and outputting a set of shift pulse signals through the plurality of output signal lines 700_1, . . . 700_n; and outputting the first voltage to the repair signal line 610, the first voltage being same as a non-operating level of the shift pulse signals.

A detailed description and a technical effect of the method may be referred to the corresponding description of the gate drive circuit 20 in the embodiments of the present disclosure, and details are not described herein again.

At least one embodiment of the present disclosure further provides a display device, which comprises the gate drive circuit according to any one of the embodiments of the present disclosure. The display device can isolate the abnormal shift register unit and ensure the output of the shift pulse signal, so as to help to improve product yield, improve maintenance efficiency, and reduce product manufacture cost.

FIG. 10 is a schematic block diagram of a display device according to some embodiments of the present disclosure. Referring to FIG. 10, a display device 30 comprises a gate drive circuit 10 or 20, the gate drive circuit 10 or 20 is the gate drive circuit according to any one of the embodiments of the present disclosure. For example, the display device 30 may be an OLED display panel, an OLED television, an OLED display, a liquid crystal display panel, a liquid crystal television, a liquid crystal display, etc., or may also be products or components having a display function such as an e-book, a mobile phone, a tablet computer, a notebook computer, a digital photo frame, a navigator, etc., and the embodiments of the present disclosure do not limit the type of the display device 30. The technical effects of the display device 30 may be referred to the corresponding description of the gate drive circuit 10 or 20 in the above embodiments, and details are not described herein again.

For example, in an example, the display device 30 comprises a display panel 3000, a gate driver 3010, a timing controller 3020 and a data driver 3030. The display panel 3000 comprises a plurality of pixel units P defined by a plurality of scanning lines GL and a plurality of data lines DL which cross each other; the gate driver 3010 is used to drive the plurality of scanning lines GL; the data driver 3030 is used to drive the plurality of data lines DL; and the timing controller 3020 is used to process the image data RGB input from the outside of the display device 30, to provide the processed image data RGB to the data driver 3030, and to output scanning control signals GCS and data control signals DCS to the gate driver 3010 and the data driver 3030, so as to control the gate driver 3010 and the data driver 3030.

For example, the gate driver 3010 comprises the gate drive circuit 10 or 20 provided by any one of the above embodiments. Pixel scanning signal output terminals OT of the plurality of shift register units in the gate drive circuit 10 or 20 are correspondingly connected to the plurality of scanning lines GL. The plurality of scanning lines GL are connected to the pixel units P arranged in a plurality of rows. For example, the gate driver 3010 may be implemented as a semiconductor chip or may be integrated in the display panel 3000 to function as a GOA circuit.

For example, the data driver 3030 converts the digital image data RGB input from the timing controller 3020 into data signals according to a plurality of data control signals DCS derived from the timing controller 3020 by using a reference gamma voltage. The data driver 3030 provides the converted data signals to the plurality of data lines DL. For example, the data driver 3030 can be implemented as a semiconductor chip.

For example, the timing controller 3020 processes the image data RGB input from the outside to match the size and resolution of the display panel 3000, and then provides the processed image data to the data driver 3030. The timing controller 3020 generates a plurality of scanning control signals GCS and a plurality of data control signals DCS by using synchronization signals (such as a dot clock DCLK, a data enable signal DE, a horizontal synchronization signal Hsync, and a vertical synchronization signal Vsync) input from the outside of the display device 30. The timing controller 3020 provides the generated scanning control signals GCS and the data control signals DCS to the gate driver 3010 and the data driver 3030 respectively, so as to control the gate driver 3010 and the data driver 3030.

The display device 30 may also comprise other components, such as a signal decoding circuit, a voltage conversion circuit, etc., and these components may, for example, adopt existing conventional components, and details are not described herein again.

At least one embodiment of the present disclosure further provides a method of manufacturing an array substrate. The method of manufacturing the array substrate can manufacture an array substrate comprising the gate drive circuit according to any embodiment of the present disclosure. The array substrate manufactured by the method can isolate the abnormal shift register unit and ensure the output of the shift pulse signal, so as to help to improve product yield, improve maintenance efficiency, and reduce product manufacture cost.

FIG. 11 is a schematic flow chart of a method of manufacturing an array substrate according to some embodiments of the present disclosure. For example, in an example, referring to FIG. 11, the method of manufacturing the array substrate comprises the following operations:

Step S110: forming a plurality of shift register units that are cascaded and a plurality of output signal lines on a base substrate, the plurality of shift register units being correspondingly connected to the plurality of output signal lines, forming a repair signal generation circuit and a repair signal line on the base substrate, the repair signal generation circuit being connected to the repair signal line, the repair signal line and the plurality of output signal lines being insulated from each other, and the repair signal line extending across the plurality of output signal lines;

Step S120: selecting a first shift register unit among the plurality of shift register units as needed, the plurality of output signal lines comprising a first output signal line, and the first shift register unit being connected to the first output signal line; and Step S130: connecting the repair signal line to the first output signal line, and disconnecting the first output signal line from the first shift register unit.

For example, when it is detected that one or some of the plurality of shift register units have a fault, the repair operation is performed by using the repair signal line and the repair signal generation circuit. These shift register units that are faulty are referred to as first shift register units, and the remaining shift register units are referred to as second shift register units. Correspondingly, an output signal line connected to a first shift register unit is referred to as a first output signal line, and an output signal line connected to a second shift register unit is referred to as a second output signal line.

For example, in an example, the method of manufacturing the array substrate further comprises: forming a plurality of cascade signal lines on the base substrate, the plurality of cascade signal lines and the plurality of output signal lines being in a same layer and are correspondingly connected. In this example, the method of manufacturing the array substrate can, for example, manufacture an array substrate comprising the gate drive circuit 10 as illustrated in FIG. 4.

For example, in another example, the method of manufacturing the array substrate further comprises: forming a plurality of cascade signal lines on the base substrate, the plurality of cascade signal lines and the repair signal line being in a same layer, the plurality of cascade signal lines extending across the plurality of output signal lines, and the plurality of cascade signal lines being correspondingly connected to the plurality of shift register units; and disconnecting a cascade signal line connected to the first shift register unit from the first shift register unit, and connecting the cascade signal line that is disconnected to the first output signal line. In this example, the method of manufacturing the array substrate can, for example, manufacture an array substrate comprising the gate drive circuit 10 as illustrated in FIG. 5.

It should be noted that, in the embodiments of the present disclosure, the method of manufacturing the array substrate is not limited to the steps and the order described above, and may comprise more or fewer steps, and the order among the steps may be determined according to actual needs. For example, in an example, the method of manufacturing the array substrate only comprises the step S110, and does not comprise the steps S120 and S130, and thus the method can, for example, manufacture an array substrate comprising the gate drive circuit 20 as illustrated in FIG. 8.

The following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A gate drive circuit, comprising a repair signal line, a plurality of output signal lines, and plurality of shift register units that are cascaded, wherein the repair signal line is configured to receive a repair signal;

the plurality of output signal lines comprises a first output signal line and a plurality of second output signal lines, and the repair signal line is connected to the first output signal line, and is configured to transmit the repair signal to the first output signal line;

the plurality of shift register units comprises a first shift register unit and a plurality of second shift register units, and the plurality of second shift register units are correspondingly connected to the plurality of second output signal lines; and the first output signal line corresponds to, but is in a state of being disconnected from, the first shift register unit, and the first output signal line and the plurality of second output signal lines are further configured to output a set of shift pulse signals, the gate drive circuit further comprises a plurality of cascade signal lines, wherein the first output signal line is connected to a next second shift register unit adjacent to the first shift register unit through a cascade signal line which corresponds to but is in a state of being disconnected from the first shift register unit, and is configured to transmit the repair signal as a trigger signal to the next second shift register unit adjacent to the first shift register unit, wherein each of the plurality of shift register units comprises a trigger signal output terminal and a pixel scanning signal output terminal, pixel scanning signal output terminals of the plurality of second shift register units are correspondingly connected to the plurality of second output signal lines, and trigger signal output terminals of the plurality of second shift register units are correspondingly connected to the plurality of cascade signal lines.

2. The gate drive circuit according to claim 1, further comprising a repair signal generation circuit, wherein the repair signal generation circuit is connected to the repair signal line, and is configured to output a repair signal to the repair signal line; and the repair signal generation circuit and the plurality of second shift register units are further configured to output the set of shift pulse signals through the first output signal line and the plurality of second output signal lines.

3. The gate drive circuit according to claim 2, wherein the repair signal line is in a layer which is different from a layer where the plurality of output signal lines are located, and the repair signal line extends across the plurality of output signal lines.

4. The gate drive circuit according to claim 2, wherein the repair signal generation circuit comprises a modulation signal output circuit and a switch circuit which are electrically connected to each other;

the modulation signal output circuit is configured to output a modulation signal to the switch circuit; and the switch circuit is configured to receive the modulation signal and control whether the modulation signal passes through the switch circuit, to output the modulation signal passing through the switch circuit as the repair signal.

5. The gate drive circuit according to claim 2, wherein the repair signal generation circuit comprises a third shift register unit, and the third shift register unit is identical in circuit structure to the first shift register unit and is configured to generate a shift pulse signal corresponding to the first shift register unit in the set of shift pulse signals, and to output the shift pulse signal as the repair signal.

6. The gate drive circuit according to claim 2, wherein each of the plurality of shift register units comprises a blanking input circuit, a display input circuit, an output circuit, a first control circuit, and a second control circuit;

the blanking input circuit is connected to a first node, and is configured to input a blanking pull-up signal to the first node, according to a blanking input signal and a blanking control signal, during a blanking period;

the display input circuit is connected to the first node, and is configured to input a display pull-up signal to the first node in response to a display input signal during a display period;

the output circuit is connected to the first node, and is configured to output a composite output signal to an output terminal under control of a level of the first node;

the first control circuit is connected to the first node and a second node, and is configured to perform noise reduction on the first node and the output terminal under control of a level of the second node; and the second control circuit is connected to the first node and the second node, and is configured to control the level of the second node under control of the level of the first node.

7. The gate drive circuit according to claim 1, wherein the plurality of cascade signal lines and the repair signal line are in a same layer, and the plurality of cascade signal lines are in the layer which is different from a layer where the plurality of output signal lines are located.

8. A method of driving the gate drive circuit according to claim 1, comprising:

controlling the plurality of shift register units that are cascaded to sequentially output; and in a case where the first shift register unit outputs, outputting the repair signal to the repair signal line, so that the first output signal line outputs the repair signal, wherein the first output signal line and the plurality of second output signal lines output the set of shift pulse signals.

9. A display device, comprising the gate drive circuit according to claim 1.

10. A gate drive circuit, comprising a repair signal line, a plurality of output signal lines, and a plurality of shift register units that are cascaded, wherein the repair signal line is configured to receive a repair signal of a first voltage;

the plurality of shift register units are correspondingly connected to the plurality of output signal lines, and are configured to output a set of shift pulse signals through the plurality of output signal lines; and the repair signal line and the plurality of output signal lines are insulated from each other, and the repair signal line extends across the plurality of output signal lines, the gate drive circuit further comprising a plurality of cascade signal lines, wherein each of the plurality of shift register units comprises a trigger signal output terminal and a pixel scanning signal output terminal, pixel scanning signal output terminals of the plurality of shift register units are correspondingly connected to the plurality of output signal lines, and trigger signal output terminals of the plurality of shift register units are correspondingly connected to the plurality of cascade signal lines.

11. The gate drive circuit according to claim 10, further comprising a repair signal generation circuit,
wherein the repair signal generation circuit is connected to the repair signal line, and is configured to output the repair signal or the first voltage to the repair signal line.

12. The gate drive circuit according to claim 11, wherein the repair signal line is in a layer which is different from a layer where the plurality of output signal lines are located.

13. The gate drive circuit according to claim 10, wherein the plurality of cascade signal lines and the repair signal line are in a same layer, and the plurality of cascade signal lines are in the layer which is different from a layer where the plurality of output signal lines are located, and
a cascade signal line and an output signal line which are connected to a same shift register unit are insulated from each other, and extend across each other.

14. A method of driving the gate drive circuit according to claim 10, comprising:
controlling the plurality of shift register units that are cascaded to sequentially output, and outputting the set of shift pulse signals through the plurality of output signal lines; and
outputting the first voltage to the repair signal line, the first voltage being same as a non-operating level of the shift pulse signals.

15. A method of manufacturing an array substrate, comprising:
forming a plurality of shift register units that are cascaded and a plurality of output signal lines on a base substrate, the plurality of shift register units being correspondingly connected to the plurality of output signal lines,
forming a repair signal generation circuit and a repair signal line on the base substrate, the repair signal generation circuit being connected to the repair signal line, the repair signal line and the plurality of output signal lines being insulated from each other, and the repair signal line extending across the plurality of output signal lines;
selecting a first shift register unit among the plurality of shift register units as needed, wherein the plurality of output signal lines comprises a first output signal line, and the first shift register unit is connected to the first output signal line; and
connecting the repair signal line to the first output signal line, and disconnecting the first output signal line from the first shift register unit;
the method of manufacturing the array substrate further comprises:
forming a plurality of cascade signal lines on the base substrate, wherein the plurality of cascade signal lines and the repair signal line are in a same layer, the plurality of cascade signal lines extend across the plurality of output signal lines, and the plurality of cascade signal lines register units comprises a trigger signal output terminal and a pixel scanning signal output terminal, pixel scanning signal output terminals of the plurality of shift register units are correspondingly connected to the plurality of output signal lines, and trigger signal output terminals of the plurality of shift register units are correspondingly connected to the plurality of cascade signal lines; and
disconnecting a cascade signal line connected to the first shift register unit from the first shift register unit, and connecting the cascade signal line that is disconnected from the first output signal line.

\* \* \* \* \*